(12) United States Patent
Kawahara et al.

(10) Patent No.: US 12,379,424 B2
(45) Date of Patent: Aug. 5, 2025

(54) BATTERY STATE DIAGNOSING DEVICE, BATTERY STATE DIAGNOSING METHOD, AND STORAGE MEDIUM

(71) Applicant: HONDA MOTOR CO., LTD., Tokyo (JP)

(72) Inventors: Takuma Kawahara, Wako (JP); Yuki Sato, Utsunomiya (JP)

(73) Assignee: HONDA MOTOR CO., LTD., Tokyo (JP)

( * ) Notice: Subject to any disclaimer, the term of this patent is extended or adjusted under 35 U.S.C. 154(b) by 331 days.

(21) Appl. No.: 18/108,680

(22) Filed: Feb. 13, 2023

(65) Prior Publication Data

US 2023/0305072 A1 Sep. 28, 2023

(30) Foreign Application Priority Data

Mar. 23, 2022 (JP) .................................. 2022-046906

(51) Int. Cl.
*G01R 31/392* (2019.01)
*G01R 31/367* (2019.01)
*G01R 31/3842* (2019.01)

(52) U.S. Cl.
CPC ......... *G01R 31/392* (2019.01); *G01R 31/367* (2019.01); *G01R 31/3842* (2019.01)

(58) Field of Classification Search
CPC . G01R 31/392; G01R 31/3842; G01R 31/367
See application file for complete search history.

(56) References Cited

U.S. PATENT DOCUMENTS

| | | |
|---|---|---|
| 2017/0225584 A1 | 8/2017 | Jin et al. |
| 2019/0113577 A1 | 4/2019 | Severson et al. |
| 2020/0247268 A1 | 8/2020 | Aoyama |
| 2022/0216700 A1* | 7/2022 | Agarwal .............. G01R 31/392 |
| 2023/0023044 A1 | 1/2023 | Konishi et al. |
| 2023/0029810 A1 | 2/2023 | Konishi et al. |

FOREIGN PATENT DOCUMENTS

| | | |
|---|---|---|
| CN | 103954915 | 7/2014 |
| CN | 110058165 | 7/2019 |
| JP | 2023-017480 | 2/2023 |

(Continued)

OTHER PUBLICATIONS

Japanese Office Action for Japanese Patent Application No. 2022-046906 mailed Nov. 7, 2023.

*Primary Examiner* — Minh Q Phan
(74) *Attorney, Agent, or Firm* — Amin, Turocy & Watson, LLP

(57) ABSTRACT

A battery state diagnosing device includes: an acquisition unit configured to acquire time-series data including at least a current value and a voltage value of a battery; a deterioration state estimating unit configured to estimate an index value associated with a deterioration state of the battery on the basis of the time-series data; a reliability evaluating unit configured to evaluate a reliability of the index value on the basis of at least one of distribution information of the voltage value included in the time-series data and distribution information of a dischargeable capacity calculated using the current value included in the time-series data; and a deterioration state determining unit configured to determine a final index value on the basis of the reliability.

16 Claims, 20 Drawing Sheets

(56) References Cited

FOREIGN PATENT DOCUMENTS

| JP | 2023-018289 | 2/2023 |
| JP | 2023-047092 | 4/2023 |
| WO | 2019/026142 | 2/2019 |
| WO | 2022/091673 | 5/2022 |

* cited by examiner

FIG. 3

| time_stamp | VOLTAGE | CURRENT | TEMPERATURE | LOW-CURRENT DURATION TIME | OCV DETERMINATION RESULT | ... |
|---|---|---|---|---|---|---|
| 2020-04-05 22:29:08 | 3.6771 | -2.17 | 19.5 | 3.0 | False | ... |
| 2020-04-05 22:29:11 | 3.6429 | 0.67 | 19.5 | 6.0 | False | ... |
| 2020-04-05 22:29:14 | 3.6585 | -2.83 | 19.5 | 9.0 | False | ... |
| 2020-04-05 22:29:18 | 3.6248 | -2.17 | 19.5 | 13.0 | True | ... |
| 2020-04-05 22:29:21 | 3.6310 | -4.33 | 19.5 | 16.0 | True | ... |
| 2020-04-05 22:29:24 | 3.4762 | 140.17 | 19.5 | 19.0 | False | ... |
| 2020-04-05 22:29:27 | 3.6429 | -1.67 | 19.5 | 0.0 | False | ... |
| 2020-04-05 22:29:30 | 3.6071 | -4.00 | 19.5 | 3.0 | False | ... |
| 2020-04-05 22:29:34 | 3.5714 | 28.83 | 19.5 | 7.0 | False | ... |
| 2020-04-05 22:29:37 | 3.5833 | 69.17 | 19.5 | 0.0 | False | ... |
| ... | ... | ... | ... | ... | ... | ... |

BATTERY STATE DIAGNOSING DEVICE, BATTERY STATE DIAGNOSING METHOD, AND STORAGE MEDIUM

CROSS-REFERENCE TO RELATED APPLICATION

Priority is claimed on Japanese Patent Application No. 2022-046906, filed Mar. 23, 2022, the content of which is incorporated herein by reference.

BACKGROUND OF THE INVENTION

Field of the Invention

The present invention relates to a battery state diagnosing device, a battery state diagnosing method, and a storage medium.

Description of Related Art

In order to reduce an amount of $CO_2$ in view of climate-related disasters, interest in battery electric vehicles has increased and use of lithium-ion secondary batteries for application to vehicles has been studied. For example, a technique of estimating a deterioration state of a battery such as a lithium-ion secondary battery is known as disclosed in PCT International Publication No. WO2019/026142.

SUMMARY OF THE INVENTION

In the related art, an Open Circuit Voltage (OCV) curve may be generated on the basis of data collected from a battery which is being used to estimate a deterioration state of the battery. However, since what data is to be acquired depends greatly on usage of the battery, estimation accuracy of a deterioration state may decrease when only data inappropriate for estimation of the deterioration state is acquired.

In the related art, it is difficult to achieve both curbing unevenness of an estimated value of the deterioration state and securing trackability of an algorithm for estimating a deterioration state with respect to a rapid change in battery capacity. For example, unevenness of an estimated value of the deterioration state can be curbed by utilizing a known estimation algorithm such as Kalman filter. However, when a degree of curbing of unevenness increases rapidly, there is concern that trackability of the estimation algorithm will deteriorate with respect to a rapid change in battery capacity.

Aspects of the present invention were invented in consideration of the aforementioned circumstances, and an objective thereof is (1) to improve the estimation accuracy of parameters associated with a deterioration state of a battery and (2) to achieve both curbing unevenness of an estimated value of a parameter and securing trackability of an algorithm for estimating the deterioration state with respect to a rapid change in battery capacity.

A battery state diagnosing device, a battery state diagnosing method, and a storage medium according to the present invention employ the following configurations.

(1) A battery state diagnosing device according to an aspect of the present invention includes: an acquisition unit configured to acquire time-series data including at least a current value and a voltage value of a battery; a deterioration state estimating unit configured to estimate an index value associated with a deterioration state of the battery on the basis of the time-series data; a reliability evaluating unit configured to evaluate a reliability of the index value on the basis of at least one of distribution information of the voltage value included in the time-series data and distribution information of a dischargeable capacity calculated using the current value included in the time-series data; and a deterioration state determining unit configured to determine a final index value on the basis of the reliability.

(2) In the aspect of (1), the deterioration state determining unit may be configured to determine the final index value by adding a newest index value and a predicted index value based on previous index values at predetermined proportions corresponding to the reliability.

(3) In the aspect of (2), the reliability evaluating unit may be configured to calculate at least one of a proportion of a voltage range of the time-series data with respect to a predetermined voltage range and a proportion of a dischargeable capacity range of the time-series data with respect to a capacity range of a reference OCV curve and to set the reliability to a lower value as the proportion becomes less.

(4) In the aspect of (2) or (3), the reliability evaluating unit may be configured to calculate an error between the time-series data and a reference OCV curve and to set the reliability to a lower value as the error becomes greater.

(5) In the aspect of any one of (2) to (4), the reliability evaluating unit may be configured to acquire a plurality of sample groups by randomly extracting some of the time-series data, to calculate a plurality of index values on the basis of the acquired plurality of sample groups, and to set the reliability to a lower value as the plurality of index values become more uneven.

(6) In the aspect of any one of (2) to (5), the reliability evaluating unit may be configured to input at least one of the distribution information of the voltage value included in the time-series data and the distribution information of the dischargeable capacity calculated using the current value included in the time-series data and an error between the time-series data and a reference OCV curve to a machine learning model and to acquire an output of the machine learning model as the reliability.

(7) In the aspect of any one of (1) to (6), the battery state diagnosing device may further include a reliability updating unit configured to update the reliability to a lower value when a difference between a newest index value and a representative value of previous index values is equal to or greater than a threshold value.

(8) A battery state diagnosing device according to another aspect of the present invention includes: an acquisition unit configured to acquire time-series data including at least a current value and a voltage value of a battery; a deterioration state estimating unit configured to estimate an index value associated with a deterioration state of the battery on the basis of the time-series data; a reliability evaluating unit configured to evaluate a reliability of the index value; an upper limit setting unit configured to set an upper limit of the reliability on the basis of the index value and the reliability; a reliability updating unit configured to update the reliability on the basis of the upper limit; and a deterioration state determining unit configured to determine a final index value on the basis of the updated reliability.

(9) In the aspect of (8), the battery state diagnosing device may further include a tracking delay error calculating unit configured to calculate a virtual index value on the basis of the reliability and a reference deterioration change line indicating a change of the index value with time and to calculate a tracking delay error which is a difference between the index value calculated on the basis of the reference deterioration change line and the virtual index value, and the upper limit setting unit may be configured to set the upper limit of the reliability to a greater value as the tracking delay error becomes larger.

(10) In the aspect of (8) or (9), the deterioration state determining unit may be configured to determine the final index value by adding a newest index value and a predicted index value based on previous index values at predetermined proportions corresponding to the reliability.

(11) In the aspect of (10), the reliability evaluating unit may be configured to calculate at least one of a proportion of a voltage range of the time-series data with respect to a predetermined voltage range and a proportion of a dischargeable capacity range of the time-series data with respect to a capacity range of a reference OCV curve and to set the reliability to a lower value as the proportion becomes less.

(12) In the aspect of (10) or (11), the reliability evaluating unit may be configured to calculate an error between the time-series data and a reference OCV curve and to set the reliability to a lower value as the error becomes greater.

(13) In any one of the aspects of (10) to (12), the reliability evaluating unit may be configured to acquire a plurality of sample groups by randomly extracting some of the time-series data, to calculate a plurality of index values on the basis of the acquired plurality of sample groups, and to set the reliability to a lower value as the plurality of index values become more uneven.

(14) In any one of the aspects of (10) to (13), the reliability evaluating unit may be configured to input at least one of distribution information of the voltage value included in the time-series data and distribution information of the dischargeable capacity calculated using the current value included in the time-series data and an error between the time-series data and a reference OCV curve to a machine learning model and to acquire an output of the machine learning model as the reliability.

(15) A battery state diagnosing method according to another aspect of the present invention is a battery state diagnosing method that is performed by a battery state diagnosing device, the battery state diagnosing method including: acquiring time-series data including at least a current value and a voltage value of a battery; estimating an index value associated with a deterioration state of the battery on the basis of the time-series data; evaluating a reliability of the index value on the basis of at least one of distribution information of the voltage value included in the time-series data and distribution information of a dischargeable capacity calculated using the current value included in the time-series data; and determining a final index value on the basis of the reliability.

(16) A non-transitory computer-readable storage medium according to another aspect of the present invention stores a program that is executed by a processor of a battery state diagnosing device, the program causing the processor to perform: acquiring time-series data including at least a current value and a voltage value of a battery; estimating an index value associated with a deterioration state of the battery on the basis of the time-series data; evaluating a reliability of the index value on the basis of at least one of distribution information of the voltage value included in the time-series data and distribution information of a dischargeable capacity calculated using the current value included in the time-series data; and determining a final index value on the basis of the reliability.

According to the aspects of (1), (15), and (16), an index value associated with a deterioration state of a battery is estimated on the basis of time-series data including at least a current value and a voltage value of a battery, a reliability of the index value is evaluated on the basis of at least one of distribution information of the voltage value included in the time-series data and distribution information of dischargeable capacity calculated using the current value included in the time-series data, and a final index value is determined on the basis of the reliability. Accordingly, since unevenness of the final index value which is finally acquired can be curbed, it is possible to enhance estimation accuracy of the index value associated with the deterioration state of the battery.

According to the aspect of (2), the final index value is determined by adding the newest index value and the predicted index value based on the previous index values at predetermined proportions corresponding to the reliability. Accordingly, it is possible to enhance estimation accuracy of the final index value.

According to the aspect of (3), at least one of the proportion of the voltage range of the time-series data with respect to a predetermined voltage range and a proportion of the dischargeable capacity range of the time series data with respect to the capacity range of the reference OCV curve is calculated, and the reliability is set to a lower value as the proportion becomes less. Accordingly, it is possible to reduce the chance of an index value with low accuracy being reflected in a diagnosis result.

According to the aspect of (4), the reliability is set to a lower value as the error between the time-series data and the reference OCV curve becomes larger. Accordingly, it is possible to reduce the chance of an index value with low accuracy being reflected in a diagnosis result.

According to the aspect of (5), a plurality of index values are calculated on the basis of a plurality of sample groups acquired by randomly extracting some of the time-series data, and the reliability is set to a lower value as the plurality of index values become more uneven. Accordingly, it is possible to reduce the chance of an index value with low accuracy being reflected in a diagnosis result.

According to the aspect of (6), since at least one of the distribution information of the voltage value included in the time-series data and the distribution information of the dischargeable capacity and the error between the time-series data and the reference OCV curve are input to a machine learning model and an output of the machine learning model is acquired as the reliability, it is possible to achieve reliability with high accuracy.

According to the aspect of (7), when the difference between the newest index value and the representative value of the previous index values is equal to or greater than the threshold value, the reliability is set to be a lower value. In this way, by decreasing the reliability when the newest index value is very far from the representative value of the previous index values, it is possible to decrease trackability of an estimation algorithm for the data.

According to the aspect of (8), the index value associated with the deterioration state of the battery is estimated on the basis of the time-series data including at least the current value and the voltage value of the battery, the reliability of the estimated index value is evaluated, the upper limit of the reliability is set on the basis of the index value and the reliability, and the final index value is determined on the basis of the reliability updated on the basis of the upper limit. Accordingly, it is possible to achieve both curbing unevenness of the final index value which is finally acquired and securing trackability of the estimation algorithm of the deterioration state with respect to a rapid change in battery capacity.

According to the aspect of (9), the tracking delay error which is a difference between the virtual index value calculated on the basis of the reliability and the reference deterioration change line and the index value calculated on the basis of the reference deterioration change line is calculated, and the upper value of the reliability is set to a larger value as the tracking delay error becomes larger. Accordingly, it is possible to more effectively achieve both curbing unevenness of the final index value which is finally acquired and securing trackability of the estimation algorithm of the deterioration state with respect to a rapid change in battery capacity.

According to the aspect of (10), it is possible to further enhance estimation accuracy of the final index value.

According to the aspects of (11) to (13), it is possible to reduce the chance of an index value with low accuracy being reflected in a diagnosis result.

According to the aspect of (14), it is possible to achieve reliability with high accuracy.

BRIEF DESCRIPTION OF THE DRAWINGS

FIG. 3 is a diagram illustrating an example of a structure of time-series data 142 and estimation data 144.

DETAILED DESCRIPTION OF THE INVENTION

Hereinafter, a battery state diagnosing device, a battery state diagnosing method, and a storage medium according to embodiments of the present invention will be described with reference to the accompanying drawings.

First Embodiment

First, a battery state diagnosing device 100 according to a first embodiment of the present invention will be described below.

[Vehicle Configuration]

Figure 1:
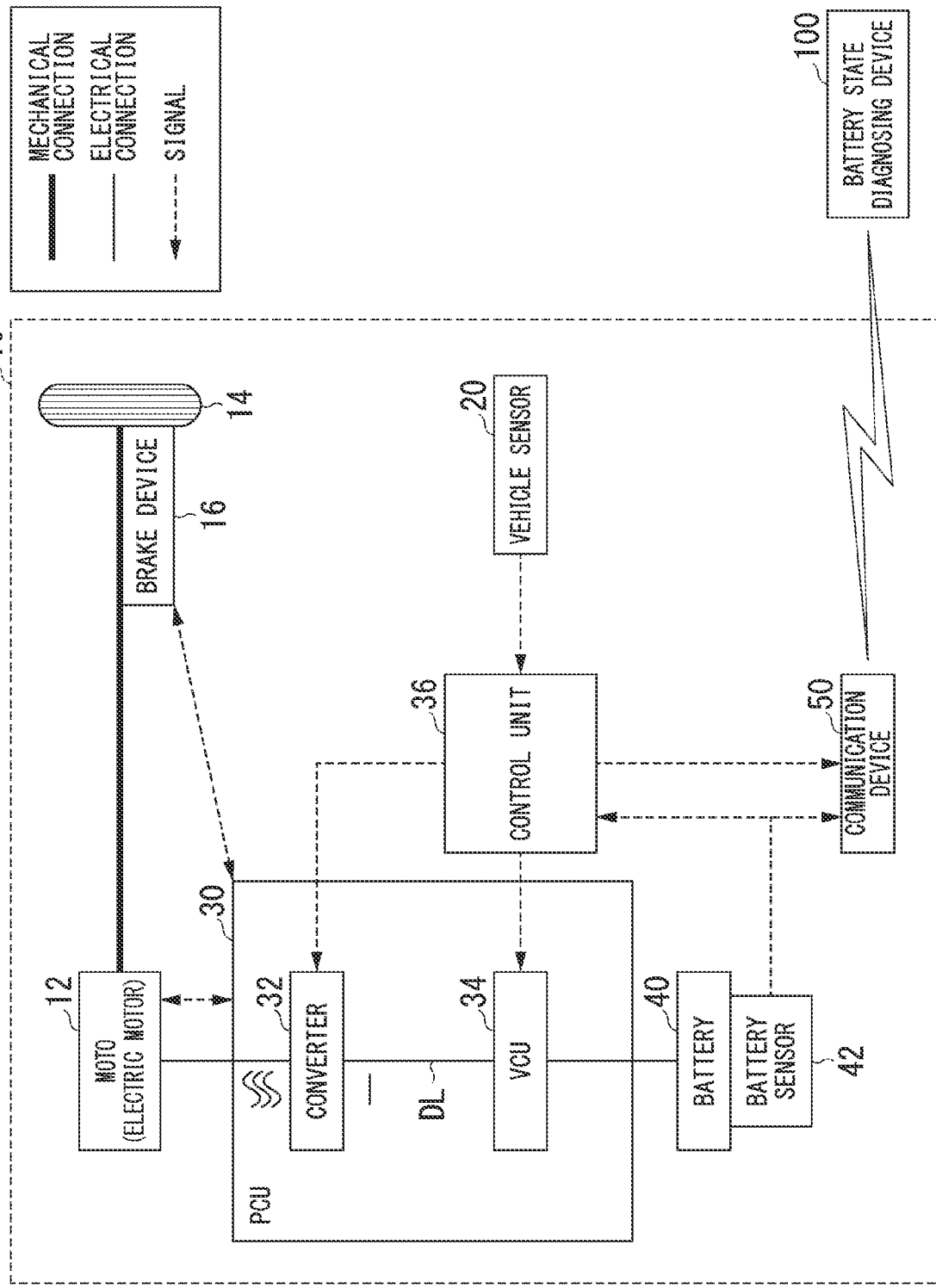
FIG. 1 is a diagram illustrating an example of a configuration of a vehicle 10 to which a battery state diagnosing device 100 according to a first embodiment is applied.

FIG. 1 is a diagram illustrating an example of a configuration of a vehicle 10 to which the battery state diagnosing device 100 according to the first embodiment is applied. The vehicle 10 illustrated in FIG. 1 is a battery electric vehicle (BEV) that travels using a motor (an electric motor) which is driven with electric power supplied from a traveling battery (secondary battery). Alternatively, the vehicle 10 may be a plug-in hybrid vehicle (PHV) or a plug-in hybrid electric vehicle (PHEV) in which an external charging function is provided in a hybrid vehicle. The vehicle 10 includes, for example, all mobile objects traveling using an electric motor which is driven with electric power supplied from a battery such as a straddling type vehicle with two wheels, a vehicle with three wheels (including a vehicle with two wheels on the front and one wheel on the rear in addition to a vehicle with one wheel on the front and two wheels on the rear), an assist type bicycle, and an electric ship in addition to a vehicle with four wheels.

The motor 12 is, for example, a three-phase AC electric motor. A rotor of the motor 12 is connected to driving wheels 14. The motor 12 is driven using electric power supplied from a power storage unit (not illustrated) provided in the battery 40 and transmits a rotational force to the driving wheels 14. The motor 12 generates electric power using kinetic energy of the vehicle 10 when the vehicle 10 decelerates.

The vehicle sensor 20 includes, for example, an accelerator position sensor, a vehicle speed sensor, and a brake position sensor. The accelerator position sensor is attached to an accelerator pedal, detects an amount of operation on the accelerator pedal by a driver, and outputs the detected amount of operation as an accelerator operation amount to a control unit 36 which will be described later. The vehicle sensor includes, for example, a wheel speed sensor attached to each wheel of the vehicle 10 and a speed calculator, derives a speed of the vehicle 10 (a vehicle speed) by combining the wheel speeds detected by the wheel speed sensors, and outputs the vehicle speed to the control unit 36. The brake position sensor is attached to a brake pedal, detects an amount of operation on a brake pedal by a driver, and outputs the detected amount of operation as a brake depression amount to the control unit 36.

A PCU 30 includes, for example, a converter 32 and a voltage control unit (VCU) 34. In the example illustrated in FIG. 1, these elements are unified as the single PCU 30, but these elements in the vehicle 10 may be dispersedly provided.

The converter 32 is, for example, an AC-DC converter. A DC-side terminal of the converter 32 is connected to a DC link DL. The battery 40 is connected to the DC link DL via the VCU 34. The converter 32 converts AC electric power generated by the motor 12 to DC electric power and outputs the DC electric power to the DC link DL.

The VCU 34 is, for example, a DC-DC converter. The VCU 34 steps up electric power supplied from the battery 40 and outputs the stepped-up electric power to the DC link DL.

The control unit 36 controls driving of the motor 12 on the basis of an output from the accelerator position sensor of the vehicle sensor 20. The control unit 36 controls the brake device 16 on the basis of an output from the brake position sensor of the vehicle sensor 20. The control unit 36 calculates, for example, a state of charge (SOC) of the battery 40 (hereinafter also referred to as a "battery charging rate") on the basis of an output from a battery sensor 42 which will be described later and which is connected to the battery 40 and outputs the calculated SOC to the VCU 34. The VCU 34 steps up a voltage of the DC link DL in accordance with an instruction from the control unit 36.

The battery 40 is, for example, a secondary battery which can be repeatedly charged and discharged such as a lithium-ion battery. A positive-electrode active material of a positive electrode of the battery 40 is a material including at least one of materials such as nickel cobalt manganese (NCM), nickel cobalt aluminum (NCA), lithium ferrorphosphate (LFP), and lithium manganese oxide (LMO), and a negative-electrode active material of a negative electrode of the battery 40 is, for example, a material including at least one of materials such as hard carbon and graphite. The battery 40 may be, for example, a cassette type battery pack which is detachably mounted in the vehicle 10. The battery 40 stores electric power supplied from an external charger (not illustrated) outside of the vehicle 10 and discharges electric power for traveling of the vehicle 10.

The battery sensor 42 detects physical quantities such as a current, a voltage, and a temperature of the battery 40. The battery sensor 42 includes, for example, a current sensor, a voltage sensor, and a temperature sensor. The battery sensor 42 detects the current of a secondary battery constituting the battery 40 (hereinafter simply referred to as a "battery 40") using the current sensor, detects the voltage of the battery 40 using the voltage sensor, and detects the temperature of the battery 40 using the temperature sensor. The battery sensor 42 outputs data of the detected physical quantities such as a current value, a voltage value, and a temperature of the battery 40 to the control unit 36 or the communication device 50.

The communication device 50 includes a wireless module for connection to a cellular network or a Wi-Fi network. The communication device 50 may include a wireless module for use of Bluetooth (registered trademark). The communication device 50 transmits and receives various types of information associated with the vehicle 10, for example, to and from the battery state diagnosing device 100 through communication using the wireless module. The communication device 50 transmits the data of physical quantities of the battery 40 output from the control unit 36 or the battery sensor 42 to the battery state diagnosing device 100. The communication device 50 may receive information indicating characteristics of the battery 40 which are diagnosed and transmitted by the battery state diagnosing device 100 which will be described later and output the received information indicating characteristics of the battery 40 to an HMI (not illustrated) of the vehicle 10.

[Configuration of Battery State Diagnosing Device 100]

Figure 2:
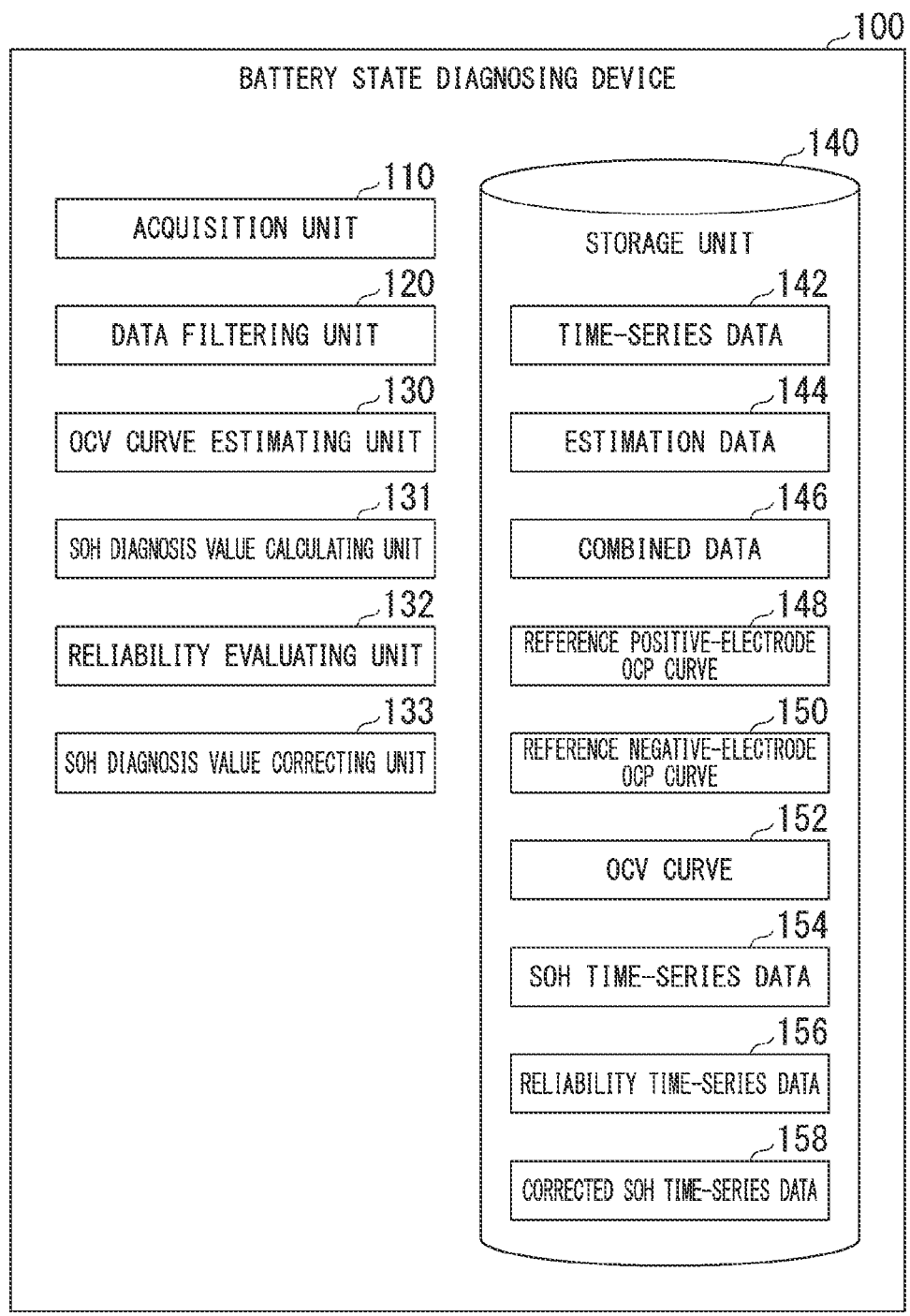
FIG. 2 is a diagram illustrating an example of a configuration of the battery state diagnosing device 100 according to the first embodiment.

An example of the battery state diagnosing device 100 that diagnoses a deterioration state of the battery 40 of the vehicle 10 will be described below. FIG. 2 is a diagram illustrating an example of a configuration of the battery state diagnosing device 100 according to the first embodiment. The battery state diagnosing device 100 includes, for example, an acquisition unit 110, a data filtering unit 120, an OCV curve estimating unit 130, an SOH diagnosis value calculating unit 131, a reliability evaluating unit 132, an SOH diagnosis value correcting unit 133, and a storage unit 140. The acquisition unit 110, the data filtering unit 120, the OCV curve estimating unit 130, the SOH diagnosis value calculating unit 131, the reliability evaluating unit 132, and the SOH diagnosis value correcting unit 133 are implemented, for example, by causing a hardware processor such as a central processing unit (CPU) to execute a program (software). Some or all of these elements may be implemented by hardware (a circuit unit including circuitry) such as a large scale integration (LSI) circuit, an application-specific integrated circuit (ASIC), a field-programmable gate array (FPGA), or a graphics processing unit (GPU) or may be cooperatively implemented by software and hardware. The program may be stored in a storage device (a storage device including a non-transitory storage medium) such as a hard disk drive (HDD) or a flash memory in advance, or may be stored in a removable storage medium (a non-transitory storage medium) such as a DVD or a CD-ROM and be installed by setting the storage medium in a drive device. The storage unit 140 is, for example, an HDD, a flash memory, or a random access memory (RAM). The storage unit 140 stores, for example, time-series data 142, estimation data 144, combined data 146, a reference positive-electrode OCP curve 148, a reference negative-electrode OCP curve 150, an OCV curve 152, SOH time-series data 154, reliability time-series data 156, and corrected SOH time-series data 158.

The acquisition unit 110 acquires time-series data of a current value, a voltage value, a temperature, and the like of the battery 40 from the communication device 50 using a communication interface (not illustrated) mounted in the battery state diagnosing device 100 and stores the acquired time-series data as the time-series data 142 in the storage unit 140. The acquisition unit 110 calculates a dischargeable capacity (an amount of discharged electric power) by integrating the current value included in the acquired time-series data and stores the dischargeable capacity as the time-series data 142 in the storage unit 140. At this time, the acquisition unit 110 may perform a process of excluding data with a loss or an abnormality from the acquired time-series data. The dischargeable capacity may be calculated by the vehicle 10 side and be transmitted to the battery state diagnosing device 100 via the communication device 50 instead of being calculated by the battery state diagnosing device 100.

The data filtering unit 120, the OCV curve estimating unit 130, and the SOH diagnosis value calculating unit 131 correspond to a deterioration state estimating unit configured to estimate an index value associated with the deterioration state of the battery on the basis of the time-series data 142 including at least the current value and the voltage value of the battery 40. In this embodiment, an example in which a state of health (SOH) is estimated as the index value associated with the deterioration state of the battery 40 will be described.

The data filtering unit 120 extracts data in which a voltage change due to charging and discharging is small, that is, a voltage change is equal to or less than a predetermined value out of the time-series data 142 stored in the storage unit 140 as the estimation data 144. FIG. 3 is a diagram illustrating an example of a structure of the time-series data 142 and the estimation data 144. In FIG. 3, time_stamp indicates a date and time at which data corresponding to each record of the time-series data 142 has been measured from the vehicle 10, voltage indicates the voltage value of the battery 40, current indicates the current value of the battery 40, low-current duration time indicates a period in which a state in which the current value of the battery 40 is equal to or less than a first threshold value (for example, 5 A) is maintained, and OCV determination result indicates a result of determination of whether the corresponding voltage value can be considered to an open-circuit voltage (OCV).

For example, regarding time-series data in which the low-current duration time is equal to or greater than a second threshold value (for example, 10 seconds) out of the time-series data 142, the data filtering unit 120 determines that the corresponding voltage value can be considered to be an OCV and sets the OCV determination result to be true. In FIG. 3, a record in which the OCV determination result is set to be true corresponds to the estimation data 144. By performing determination associated with the low-current duration time in addition to determination associated with the current value, it is possible to reduce an influence of a response delay of a circuit and to reliably extract the voltage value which can be considered to be an OCV. At this time, when the temperature of the battery is equal to or less than a third threshold value, the data filtering unit 120 may increase the second threshold value. That is, the data filtering unit 120 may increase a threshold value for the low-current duration time with which the voltage value can be considered to be an OCV when the temperature of the battery is low. This is because a period until the voltage value converges tends to increase when the temperature of the battery is low.

For example, regarding time-series data in which the current value is equal to or less than a fourth threshold value out of the time-series data 142, the data filtering unit 120 may determine that the corresponding voltage value can be considered to be an OCV and set the OCV determination result to be true, or may determine that the corresponding voltage value can be considered to be an OCV by calculating a voltage differential value and determining whether the voltage differential value is equal to or less than a fifth threshold value. The data filtering unit 120 may directly calculate a rate of change of the voltage value and determine that time-series data in which the calculated rate of change is equal to or less than a predetermined value is data which can be considered to be an OCV. The data filtering unit 120 stores the estimation data 144 extracted from the time-series data 142 in the storage unit 140.

The OCV curve estimating unit 130 converts the reference positive-electrode OCP curve 148 to a positive-electrode OCP curve 148 # indicating a change in open-circuit potential with respect to a dischargeable capacity of the positive electrode according to a first parameter group which will be described later, converts the reference negative-electrode OCP curve 150 to a negative-electrode OCP curve 150 # indicating a change in open-circuit potential with respect to the dischargeable capacity of the negative electrode according to a second parameter group which will be described later, and estimates the OCV curve 152 indicating a change in open-circuit voltage with respect to a change in capacity of the battery 40 by subtracting the negative-electrode OCP curve 150 # from the positive-electrode OCP curve 148 # which are obtained through the conversions.

The OCV curve estimating unit 130 optimizes the OCV curve 152 such that a value of an error function which is calculated on the basis of the estimated OCV curve 152 and the estimation data 144 extracted by the data filtering unit 120 is equal to or less than a threshold value. The optimized OCV curve 152 represents the finally estimated characteristics of the battery 40. The specific optimization process of the OCV curve 152 will be described later.

Figure 4:
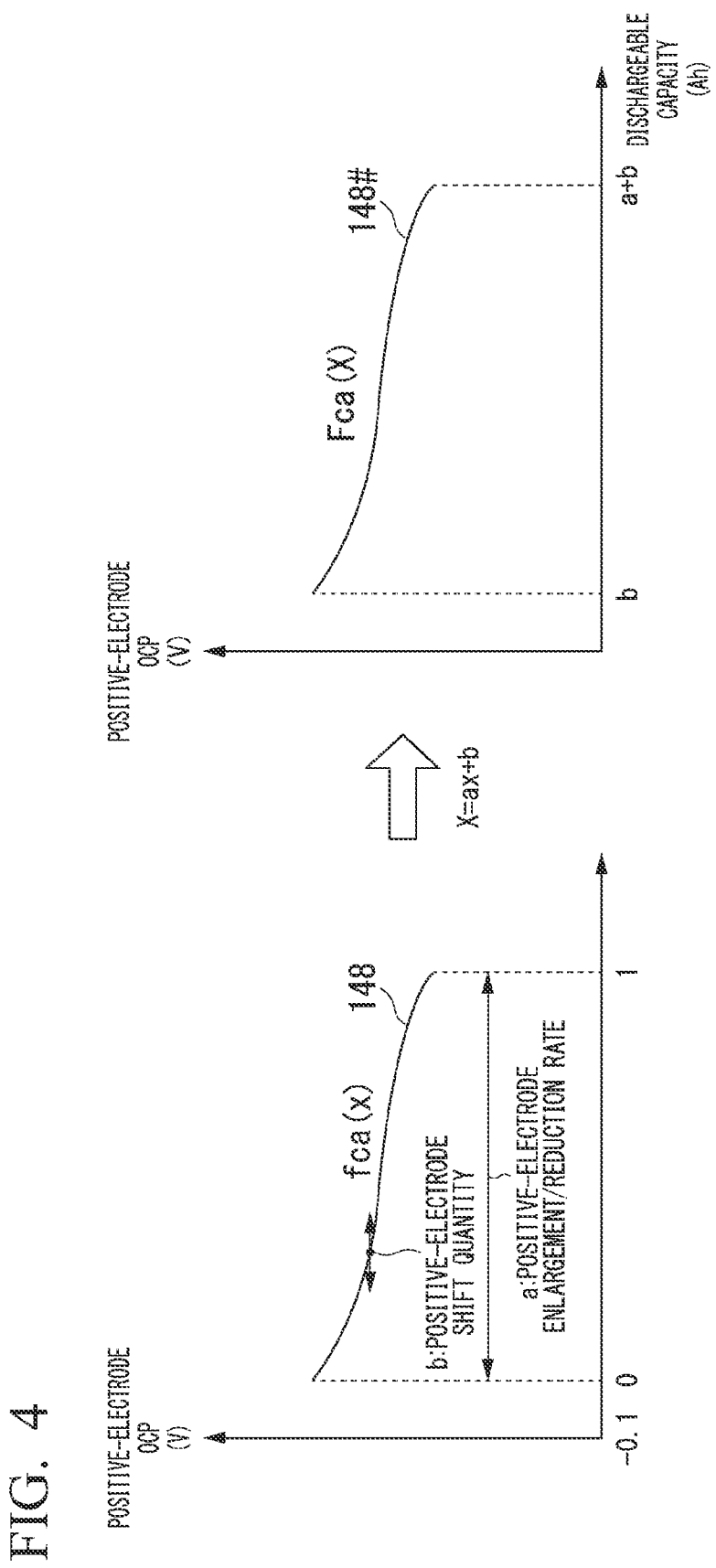
FIG. 4 is a diagram illustrating an example of a reference positive-electrode open circuit potential (OCP) curve 148 and a positive-electrode OCP curve 148 # which is acquired by converting the reference positive-electrode OCP curve 148.

FIG. 4 is a diagram illustrating an example of the reference positive-electrode OCP curve 148 and the positive-electrode OCP curve 148 # obtained by converting the reference positive-electrode OCP curve 148. The left part of FIG. 4 illustrates the reference positive-electrode OCP curve 148, and the right part of FIG. 4 illustrates the positive-electrode OCP curve 148 # obtained by converting the reference positive-electrode OCP curve 148.

As illustrated in the left part of FIG. 4, the reference positive-electrode OCP curve 148 indicates a mathematical model $f_{ca}(x)$ serving as a reference for deriving the positive-electrode OCP curve 148 # indicating a change in open-circuit potential with respect to the dischargeable capacity of the positive electrode, and the width of the dischargeable capacity x is normalized with 1. The OCV curve estimating unit 130 converts the reference positive-electrode OCP curve 148 to the positive-electrode OCP curve 148 # using a positive-electrode enlargement/reduction rate a at which the normalized width of the dischargeable capacity of the positive electrode changes to the actual width of the dischargeable capacity and a positive-electrode shift quantity b which is a shift quantity in a dischargeable capacity direction from the reference positive-electrode OCP curve 148 to the positive-electrode OCP curve 148 #.

More specifically, the OCV curve estimating unit 130 acquires a mathematical model $f_{ca}(X)$ indicating the positive-electrode OCP curve 148 # by converting a dimensionless variable x to a variable X with the same dimension as the dischargeable capacity (Ah) using $X=ax+b$ and substituting $x=(X-b)/a$ into $f_{ca}(x)$. In this way, the positive-electrode enlargement/reduction rate a and the positive-electrode shift quantity b are an example of a "first parameter group."

Figure 5:
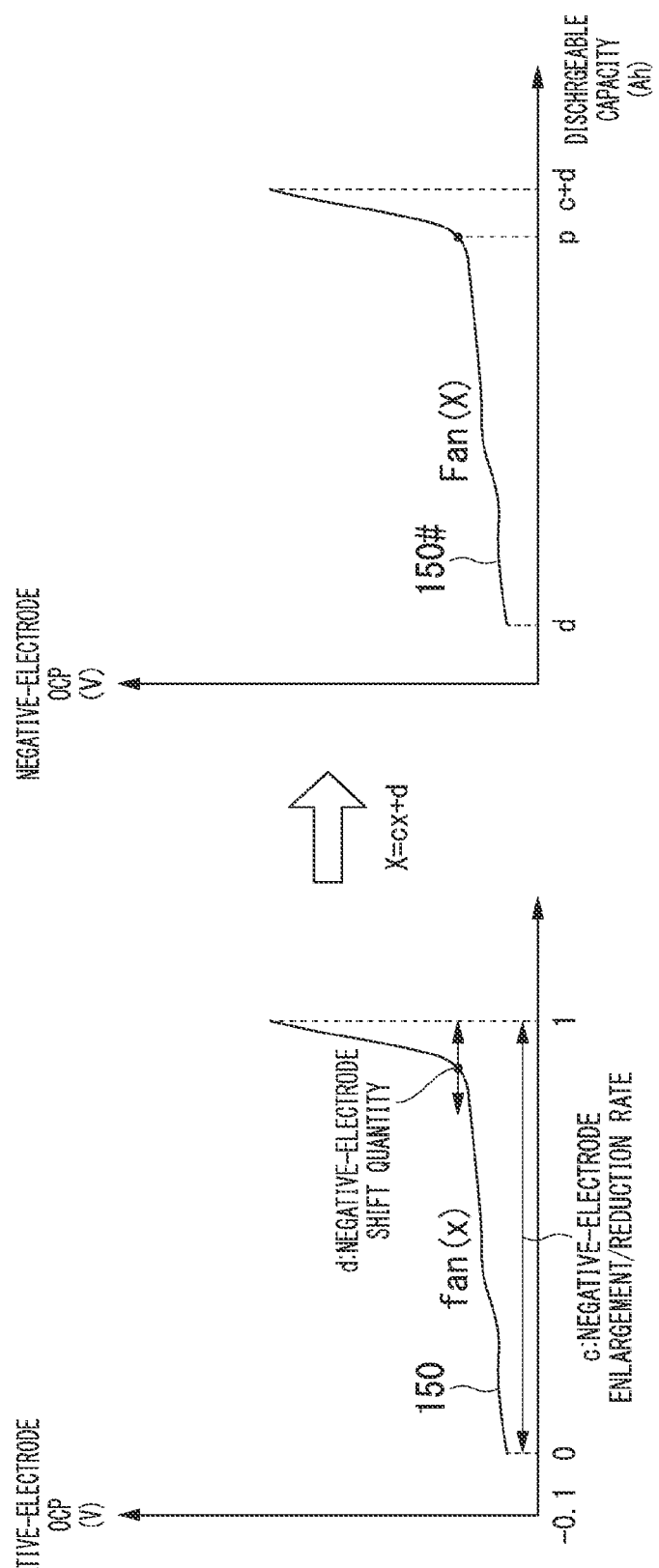
FIG. 5 is a diagram illustrating an example of a reference negative-electrode OCP curve 150 and a negative-electrode OCP curve 150 # which is acquired by converting the reference negative-electrode OCP curve 150.

FIG. 5 is a diagram illustrating an example of the reference negative-electrode OCP curve 150 and the negative-electrode OCP curve 150 # obtained by converting the reference negative-electrode OCP curve 150. The left part of FIG. 5 illustrates the reference negative-electrode OCP curve 150, and the right part of FIG. 5 illustrates the negative-electrode OCP curve 150 # obtained by converting the reference negative-electrode OCP curve 150.

As illustrated in the left part of FIG. 5, the reference negative-electrode OCP curve 150 indicates a mathematical model $f_{an}(x)$ serving as a reference for deriving the negative-electrode OCP curve 150 # indicating a change in open-circuit potential with respect to the dischargeable capacity of the negative electrode, and the width of the dischargeable capacity x is normalized with 1. The OCV curve estimating unit 130 converts the reference negative-electrode OCP curve 150 to the negative-electrode OCP curve 150 # using a negative-electrode enlargement/reduction rate c at which the normalized width of the dischargeable capacity of the negative electrode changes to the actual width of the dischargeable capacity and a negative-electrode shift quantity d which is a shift quantity in a dischargeable capacity direction from the reference negative-electrode OCP curve 150 to the negative-electrode OCP curve 150 #.

More specifically, the OCV curve estimating unit 130 acquires a mathematical model $f_{an}(X)$ indicating the negative-electrode OCP curve 150 # by converting a dimensionless variable x to a variable X with the same dimension as the dischargeable capacity (Ah) using X=cx+d and substituting x=(X−d)/c into $f_{an}(x)$. In this way, the negative-electrode enlargement/reduction rate c and the positive-electrode shift quantity d are an example of a "second parameter group."

In FIGS. 4 and 5, for example, the width of the dischargeable capacity x in the reference positive-electrode OCP curve 148 and the reference negative-electrode OCP curve 150 is normalized with 1. However, the present invention is not limited to such a configuration, and the reference positive-electrode OCP curve 148 and the reference negative-electrode OCP curve 150 may be standardized with an arbitrary value as long as there is a mathematical model serving as a reference for optimizing the first parameter group and the second parameter group.

Figure 6:
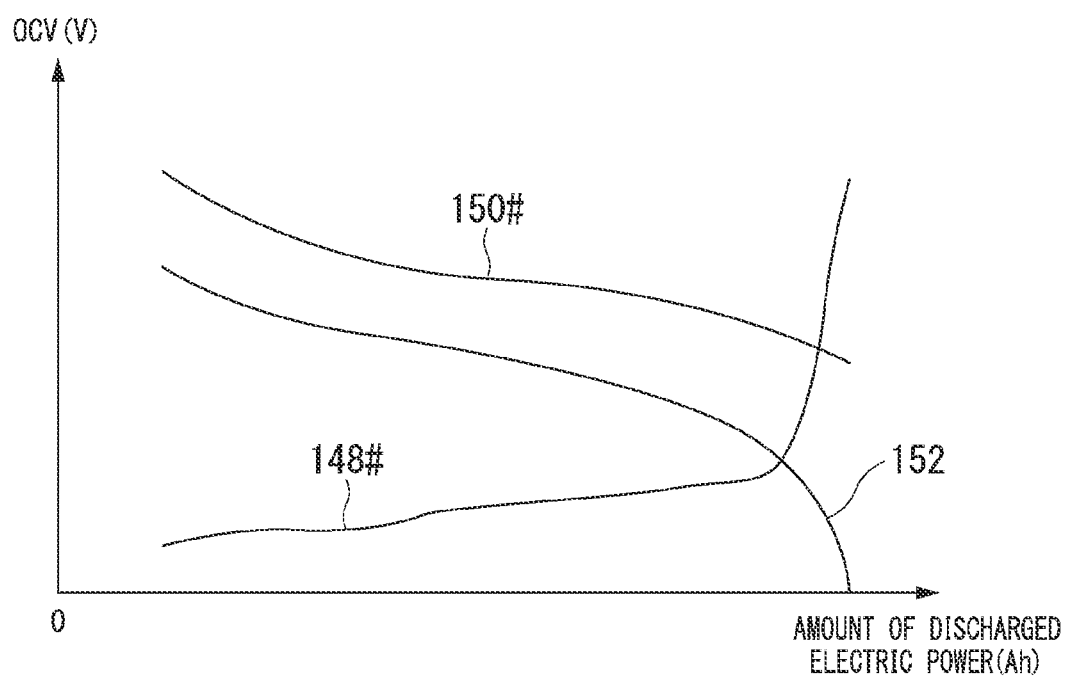
FIG. 6 is a diagram illustrating an example of an OCV curve 152 which is derived on the basis of the positive-electrode OCP curve 148 # and the negative-electrode OCP curve 150 #.

FIG. 6 is a diagram illustrating an example of the OCV curve 152 which is derived on the basis of the positive-electrode OCP curve 148 # and the negative-electrode OCP curve 150 #. As illustrated in FIG. 6, the OCV curve estimating unit 130 estimates the OCV curve 152 by subtracting the negative-electrode OCP curve 150 # illustrated in FIG. 5 from the positive-electrode OCP curve 148 # illustrated in FIG. 4. Then, the OCV curve estimating unit 130 optimizes the first parameter group and the second parameter group such that a value of an error function indicating an error between the estimated OCV curve 152 and the combined data 146 acquired by combining the estimation data 144 associated with multiple trips of the vehicle 10 is equal to or less than a threshold value.

Figure 7:
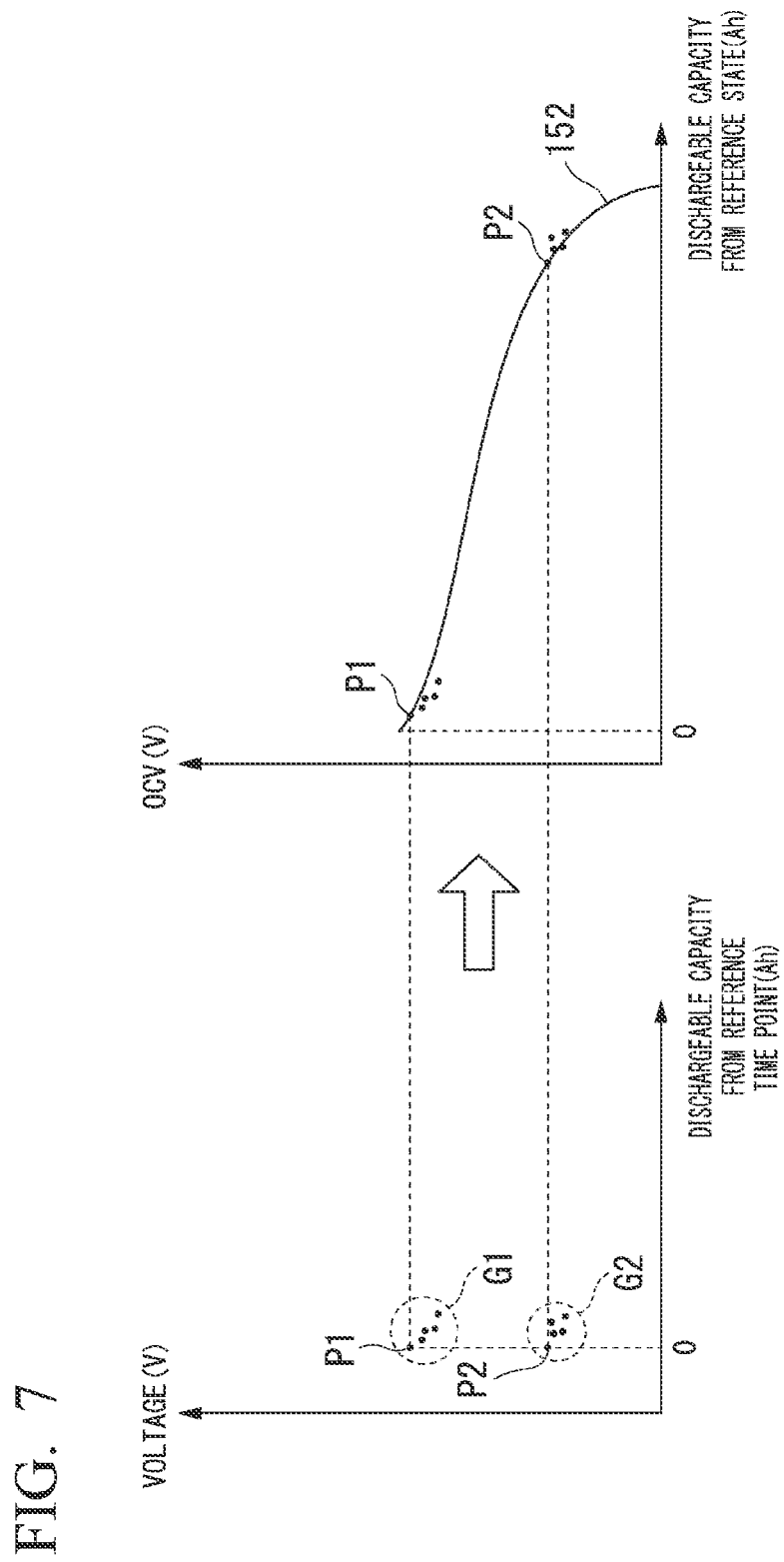
FIG. 7 is a diagram illustrating an example of a method of combining the estimation data 144 associated with multiple trips of the vehicle 10 into the combined data 146.

FIG. 7 is a diagram illustrating an example of a method of combining the estimation data 144 associated with multiple trips of the vehicle 10 into the combined data 146. In FIGS. 7, G1 and G2 indicate groups of the estimation data 144 associated with multiple trips of the vehicle 10. A point P1 of the group G1 and a point P2 of the group G2 represent combinations of a voltage and a dischargeable capacity when every traveling starts.

As illustrated in the left part of FIG. 7, the dischargeable capacity stored in the time-series data 142 is a value which is measured with a traveling start time point defined as 0 Ah and with the traveling start time point as a reference time point. On the other hand, as illustrated in the right part of FIG. 7, the dischargeable capacity of the OCV curve 152 is a value which is measured with a set fully charged state defined as 0 Ah and with the fully charged state as a reference state. Accordingly, raw data of the dischargeable capacities of the estimation data 144 associated with multiple trips cannot be used for the optimization process of the OCV curve 152. Accordingly, the OCV curve estimating unit 130 converts both the groups G1 and G2 of the estimation data 144 associated with multiple trips as a whole to the same dimension as the OCV curve 152 (estimates a dischargeable capacity from the fully charged state) by applying a voltage value at a predetermined timing in multiple trips (voltage values at P1 and P2 in FIG. 7) to the OCV curve 152 estimated by the OCV curve estimating unit 130. Here, the predetermined timing is a timing at which the voltage value in the time-series data can be considered to be an OCV such as when the vehicle 10 starts or when the vehicle 10 stops at a crossroad. The OCV curve estimating unit 130 stores data acquired through this conversion as the combined data 146 in the storage unit 140. In this embodiment, the OCV curve estimating unit 130 combines the estimation data 144 associated with multiple trips of the vehicle 10 into the combined data 146, but a module other than the OCV curve estimating unit 130 may serve as a traveling data combining unit and generate the combined data 146.

Figure 8:
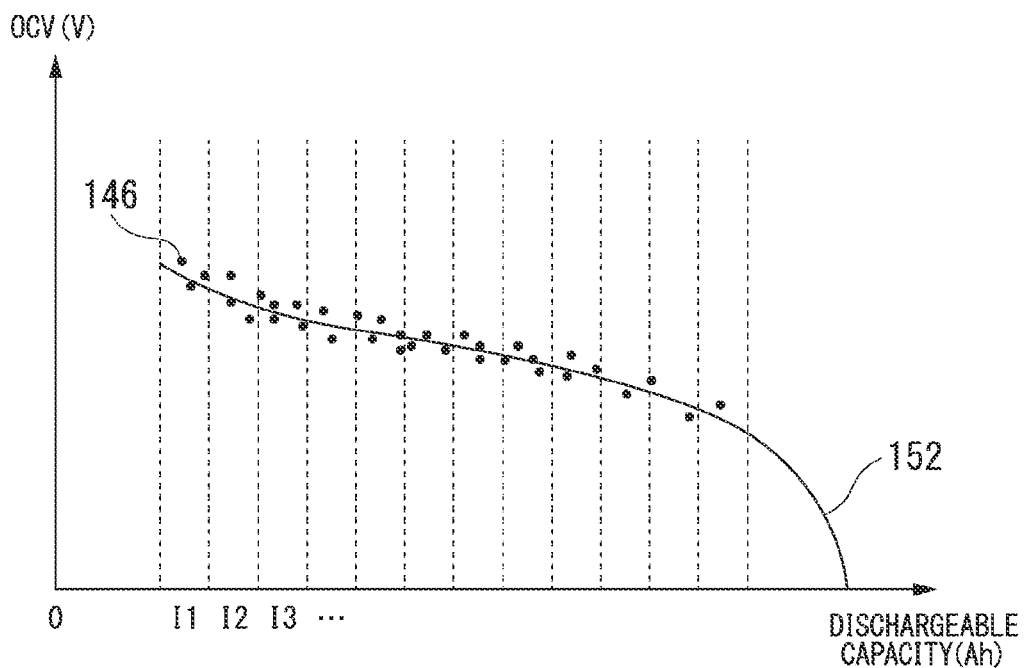
FIG. 8 is a diagram illustrating a process of optimizing the OCV curve 152 which is performed by an OCV curve estimating unit 130.

FIG. 8 is a diagram illustrating the optimization process of the OCV curve 152 which is performed by the OCV curve estimating unit 130. As illustrated in FIG. 8, the OCV curve estimating unit 130 optimizes the first parameter group and the second parameter group such that a value of an error function indicating the error between the estimated OCV curve 152 and the combined data 146 is equal to or less than a predetermined value. More specifically, the OCV curve estimating unit 130 optimizes the first parameter group and the second parameter group, for example, such that the value of the error function is equal to or less than the predetermined value using a local optimization algorithm such as a BFGS method, a conjugate gradient method, or a COBYLA method or a global optimization algorithm such as a genetic algorithm, an SHGO method, or a normalization method.

At this time, the OCV curve estimating unit 130 sets a function increasing according to a sum of values acquired by weighting the errors between the OCV curve 152 and the combined data 146 as the error function. More specifically, first, the OCV curve estimating unit 130 divides the dischargeable capacity (Ah) into predetermined sections $I_1$, $I_2$, $I_3$, ... and calculates data volumes $n_1$, $n_2$, $n_3$, ... included in the sections. Then, the OCV curve estimating unit 130 calculates weights $w_k$ for each section as $w_k=(1/n_k)/(\text{sum}(1/n_i))$ by calculating reciprocals of the data volumes $n_1$, $n_2$, $n_3$, .... Then, the OCV curve estimating unit 130 defines a weighted root mean square error (RMSE) as the error function using the calculated weights as expressed by Expression (1).

$$\text{Weighted } RMSE = \sqrt{\frac{\sum_{i=1}^{N}(Pred_i - Act_i)^2 \times w_i}{N}} \quad (1)$$

In Expression (1), $Pred_i$ denotes an open-circuit voltage estimated value on the OCV curve 152, $Act_i$ denotes an open-circuit voltage value stored in the combined data 146. Expression (1) calculates an error, for example, by calculating a root of a mean square error, but the present invention is not limited thereto and a radical root of an arbitrary exponent of a root mean square error may be used. Alternatively, the OCV curve estimating unit 130 may define a weighted mean absolute error (MAE) as the error function using the calculated weights as expressed by Expression (2). By performing this weighting, it is possible to prevent the OCV curve 152 from being excessively fitted to the combined data 146 in a section with a large data volume.

$$\text{Weighted } MAE = \frac{\sum_{i=1}^{N}(|Pred_i - Act_i| \times w_i)}{N} \quad (2)$$

In FIG. 8, an example in which the data volume of the combined data 146 is counted for each section of the dischargeable capacity (that is, in the horizontal-axis direction) and a weight $w_k$ corresponding to the section is calculated is illustrated, but the present invention is not limited thereto. For example, the data volume of the combined data 146 may be counted for each section of the voltage (that is, in the vertical-axis direction, and the weight $w_k$ corresponding to the section may be calculated. The method of calculating the weight $w_k$ is not limited to the method of calculating a reciprocal, and the weight may be calculated such that a smaller value is allocated to a section with a larger data volume.

The SOH diagnosis value calculating unit 131 calculates an SOH diagnosis value on the basis of the OCV curve 152 estimated by the OCV curve estimating unit 130 as an index value associated with the deterioration state of the battery 40. For example, the SOH diagnosis value calculating unit 131 calculates a difference between the dischargeable capacity at a fully charged voltage and the dischargeable capacity at a fully discharged voltage as a fully charged capacity FCC on the basis of the OCV curve 152. The SOH diagnosis value calculating unit 131 calculates an SOH diagnosis value by substituting the calculated fully charged capacity FCC and an initial fully charged capacity FCC0 of the battery 40 into Expression (3). The initial fully charged capacity FCC0 of the battery 40 is stored in the storage unit 140 in advance. The SOH diagnosis value calculating unit 131 stores the calculated SOH diagnosis value in the storage unit 140 in correlation with a date and time at which the OCV curve 152 has been acquired. Accordingly, SOH time-series data 154 which is time-series data of the SOH diagnosis value is stored in the storage unit 140.

$$SOH=(FCC/FCC0)\times 100 \quad (3)$$

The reliability evaluating unit 132 evaluates a reliability of the SOH diagnosis value on the basis of at least one of distribution information of the voltage value included in the combined data 146 and distribution information of the dischargeable capacity calculated using the current value included in the combined data 146. Specifically, the reliability evaluating unit 132 calculates a diagnosis value reliability G indicating the reliability of the SOH diagnosis value on the basis of the combined data 146 and the OCV curve 152. Three examples including a first example, a second example, and a third example can be used as a method of calculating the diagnosis value reliability G. The first example of the method of calculating the diagnosis value reliability G will be first described below.

First Example

Figure 9:
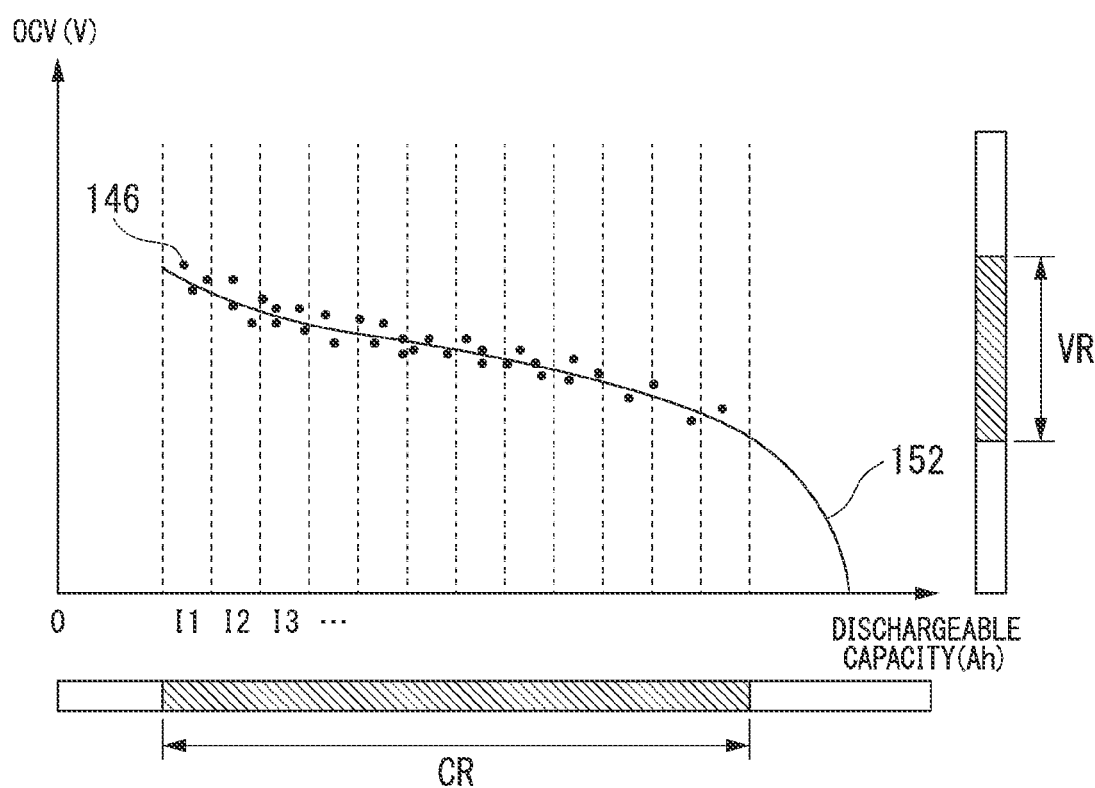
FIG. 9 is a diagram illustrating a first example of a method of calculating a diagnosis value reliability G.

FIG. 9 is a diagram illustrating the first example of the method of calculating the diagnosis value reliability G. As illustrated in FIG. 9, in the first example, the reliability evaluating unit 132 sets a predetermined voltage range VR, divides the voltage range VR into a plurality of sections, and determines whether there is combined data 146 in each section. For example, the reliability evaluating unit 132 divides the voltage range VR from 3 (V) to 4 (V) into ten sections. In this case, each section has a voltage width of 0.1 (V). The reliability evaluating unit 132 calculates a voltage range proportion r by counting the number of sections in which there is at least one piece of combined data 146 out of the ten sections and dividing the counting result by the total number of sections (that is, ten). For example, when the number of sections in which there is at least one piece of combined data 146 out of the ten sections is 10, the voltage range proportion r is "1." For example, when the number of sections in which there is at least one piece of combined data 146 out of the ten sections is 5, the voltage range proportion r is "0.5."

Figure 10:
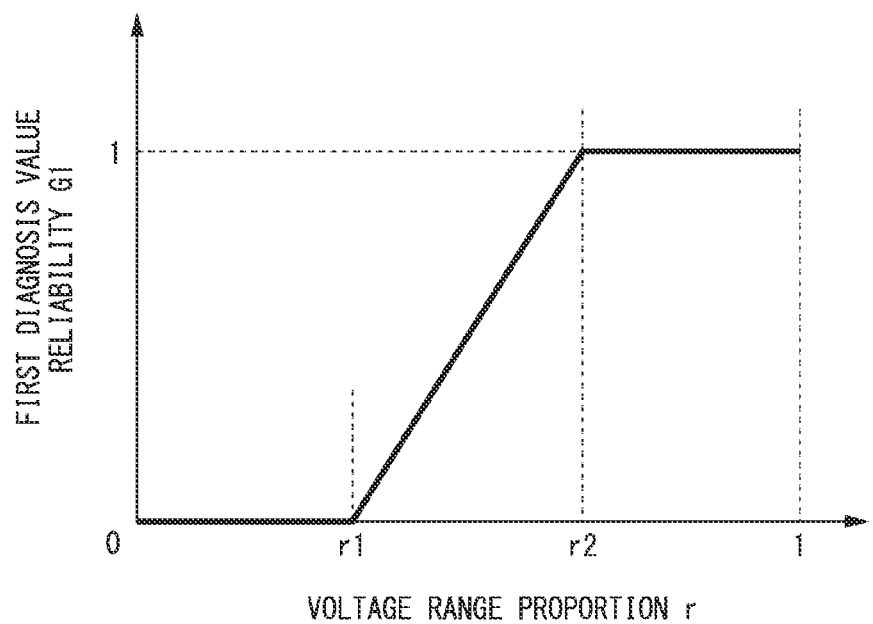
FIG. 10 is a diagram illustrating an example of a first map indicating a relationship between a voltage range proportion r and a first diagnosis value reliability G1.

The reliability evaluating unit 132 acquires a first diagnosis value reliability G1 on the basis of the calculated voltage range proportion r and a first map stored in the storage unit 140. The first map is map data indicating a relationship between the voltage range proportion r and the first diagnosis value reliability G1. FIG. 10 is a diagram illustrating an example of the first map. As illustrated in FIG. 10, the first map is set such that the first diagnosis value reliability G1 is "0" when the value of the voltage range proportion r is in a range from "0" to a first threshold value r1. The first map is set such that the first diagnosis value reliability G1 is "1" when the value of the voltage range proportion r is in a range from a second threshold value r2 to "1." The second threshold value r2 is greater than the first threshold value r1. In addition, the first map is set such that the first diagnosis value reliability G1 increases in proportion to the voltage range proportion r when the value of the voltage range proportion r is in a range from the first threshold value r1 to the second threshold value r2. The reliability evaluating unit 132 acquires the first diagnosis value reliability G1 corresponding to the calculated voltage range proportion r from the first map set as described above.

Subsequently, the reliability evaluating unit 132 calculates a fitting error e between the combined data 146 and the OCV curve 152. For example, the reliability evaluating unit 132 calculates a root mean square error (RMSE) between the combined data 146 and the OCV curve 152 as the fitting error e. The reliability evaluating unit 132 may calculate a known error other than the RMSE as the fitting error e or may calculate the fitting error e using an original method.

Figure 11:
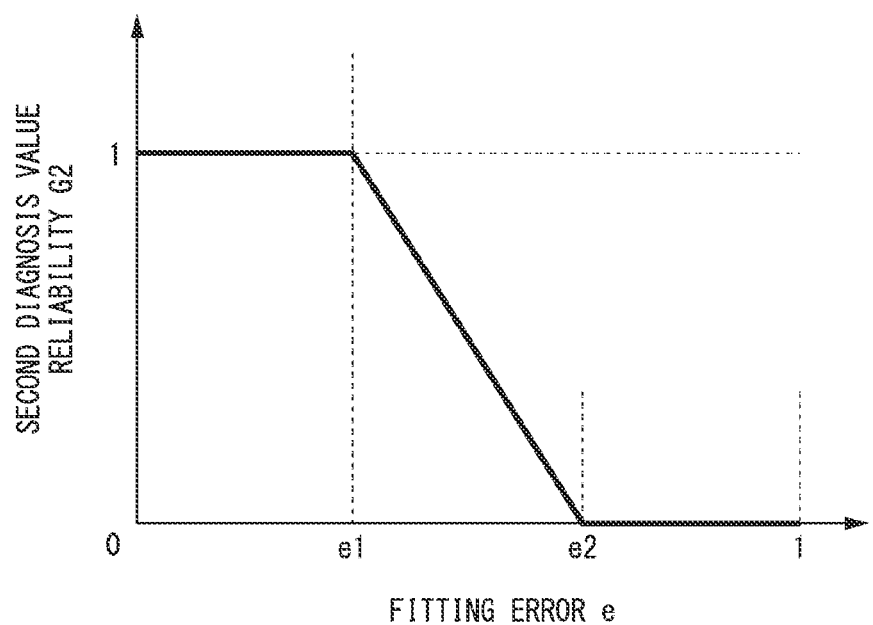
FIG. 11 is a diagram illustrating an example of a second map indicating a relationship between a fitting error e and a second diagnosis value reliability G2.

The reliability evaluating unit 132 acquires a second diagnosis value reliability G2 on the basis of the fitting error e calculated as described above and a second map stored in the storage unit 140. The second map is map data indicating a relationship between the fitting error e and the second diagnosis value reliability G2. FIG. 11 is a diagram illustrating an example of the second map. As illustrated in FIG. 11, the second map is set such that the second diagnosis value reliability G2 is "1" when the value of the fitting error e is in a range from "0" to a first threshold value e1. The second map is set such that the second diagnosis value reliability G2 is "0" when the value of the fitting error e is in a range from a second threshold value e2 to "1." The second threshold value e2 is greater than the first threshold value e1. In addition, the second map is set such that the second diagnosis value reliability G2 decreases in inverse proportion to the fitting error e when the value of the fitting error e is in a range from the first threshold value e1 to the second threshold value e2. The reliability evaluating unit 132 acquires the second diagnosis value reliability G2 corresponding to the calculated fitting error e from the second map set as described above.

Then, the reliability evaluating unit 132 calculates the diagnosis value reliability G on the basis of the first diagnosis value reliability G1 and the second diagnosis value reliability G2 which have been acquired as described above. For example, the reliability evaluating unit 132 calculates the diagnosis value reliability G by substituting the first diagnosis value reliability G1 and the second diagnosis value reliability G2 into Expression (4).

$$G=(G1+G2)/2 \qquad (4)$$

As illustrated in FIG. 9, the reliability evaluating unit 132 may set a predetermined capacity range CR, divide the capacity range CR into a plurality of sections, and determine whether there is combined data 146 in each section. In this case, the reliability evaluating unit 132 calculates a capacity range proportion by counting the number of sections in which there is at least one piece of combined data 146 out of the plurality of sections of the capacity range CR and dividing the counting result by the total number of sections. The reliability evaluating unit 132 acquires the first diagnosis value reliability G1 on the basis of the calculated capacity range proportion and a third map stored in the storage unit 140 in advance. Although not illustrated, the third map is map data indicating a relationship between the capacity range proportion and the first diagnosis value reliability G1. Setting details of the third map are the same as the first map.

In this way, the reliability evaluating unit 132 may calculate the capacity range proportion instead of the voltage range proportion r and acquire the first diagnosis value reliability G1 corresponding to the calculated capacity range proportion from the third map. The reliability evaluating unit 132 may calculate an average value of the first diagnosis value reliability G1 acquired from the voltage range proportion r and the first diagnosis value reliability G1 acquired from the capacity range proportion as a final first diagnosis value reliability G1.

As described above, the reliability evaluating unit 132 calculates at least one of a proportion of the voltage range of the combined data 146 with respect to a predetermined voltage range VR (the voltage range proportion r) and a proportion of the dischargeable capacity range of the combined data 146 with respect to the capacity range CR of a reference OCV curve (the OCV curve 152) and sets the reliability (the first diagnosis value reliability G1) to a lower value as the proportion becomes smaller. The reliability evaluating unit 132 calculates an error between the combined data 146 and the reference OCV curve (the OCV curve 152) (the fitting error e) and sets the reliability (the second diagnosis value reliability G2) to a lower value as the error becomes greater.

Second Example

The second example of the method of calculating the diagnosis value reliability G will be described below.

Figure 12:
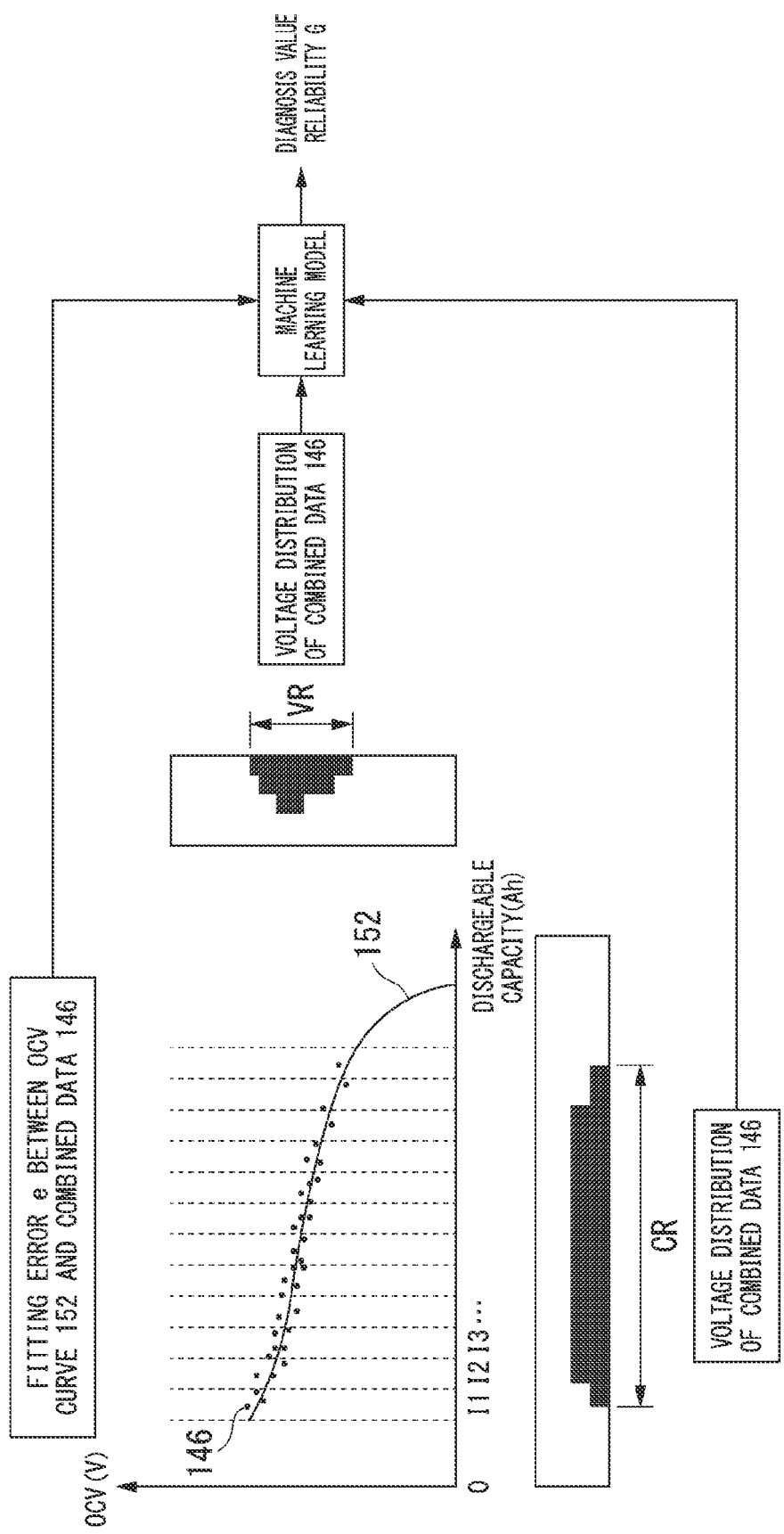
FIG. 12 is a diagram illustrating a second example of the method of calculating a diagnosis value reliability G.

FIG. 12 is a diagram illustrating the second example of the method of calculating the diagnosis value reliability G. As illustrated in FIG. 12, in the second example, the reliability evaluating unit 132 calculates a fitting error e between the combined data 146 and the OCV curve 152, a voltage distribution of the combined data 146, and a capacity distribution of the combined data 146. Similarly to the first example, the reliability evaluating unit 132 may calculate a known error such as the RMSE as the fitting error e or may calculate the fitting error e using an original method.

For example, the reliability evaluating unit 132 calculates a histogram indicating the number of pieces of the combined data 146 in each section as the voltage distribution by setting a predetermined voltage range VR, dividing the voltage range VR into a plurality of sections, and counting the number of pieces of the combined data 146 included in each section. For example, the reliability evaluating unit 132 calculates a histogram indicating the number of pieces of the combined data 146 in each section as the capacity distribution by setting a predetermined capacity range CR, dividing the capacity range CR into a plurality of sections, and counting the number of pieces of the combined data 146 included in each section.

The reliability evaluating unit 132 calculates the diagnosis value reliability G by inputting the calculated fitting error e and the voltage distribution and the capacity distribution of the combined data 146 to a machine learning model which is obtained by performing machine learning such as deep learning in advance. The machine learning model is a mathematical model with the fitting error e and the voltage distribution and the capacity distribution of the combined data 146 as inputs and with the diagnosis value reliability G as an output. That is, the reliability evaluating unit 132 inputs the fitting error e and the voltage distribution and the capacity distribution of the combined data 146 to the machine learning model and acquires the output of the machine learning model as the diagnosis value reliability G. The machine learning model is stored in the storage unit 140 in advance.

For example, training data which is used for machine learning can be acquired in the following order.

(1) The OCV curve 152 and the combined data 146 are virtually generated using a voltage simulation model.

(2) The voltage distribution and the capacity distribution of the combined data 146 which is virtually generated are calculated.

(3) The fitting error e between the virtually generated combined data 146 and the virtually generated OCV curve 152 is calculated.

(4) The processes of (2) and (3) are performed in various patterns.

(5) Big data including the voltage distribution, the capacity distribution, and the fitting error e acquired in the process of (4) is acquired as training data.

The machine learning model is not particularly limited as long as it is a model with at least one of the voltage distribution of the combined data 146 and the capacity distribution of the combined data 146 and the fitting error e as inputs.

Third Example

The third example of the method of calculating the diagnosis value reliability G will be described below.

In the third example, the reliability evaluating unit 132 samples the combined data 146 in a plurality of different patterns and calculates an SOH diagnosis value for each pattern on the basis of the sampled combined data 146. Then, the reliability evaluating unit 132 calculates an unevenness of the SOH diagnosis values calculated for the patterns as a diagnosis unevenness α. For example, the reliability evaluating unit 132 calculates a standard deviation of the SOH diagnosis values calculated for the patterns as the diagnosis unevenness α.

Figure 13:
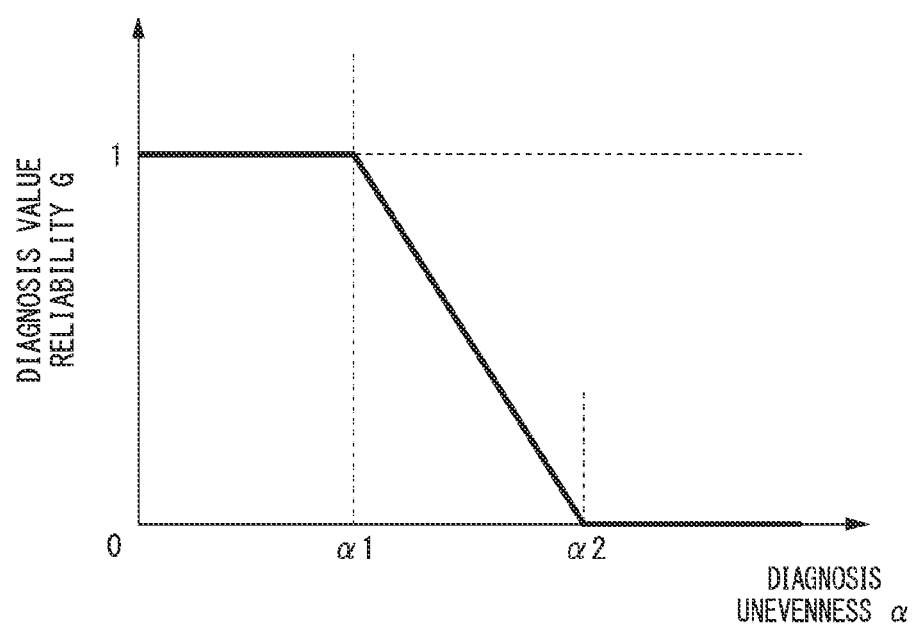
FIG. 13 is a diagram illustrating an example of a third map indicating a relationship between a diagnosis unevenness α and the diagnosis value reliability G.

The reliability evaluating unit 132 acquires a diagnosis value reliability G on the basis of the calculated diagnosis unevenness α and a fourth map stored in the storage unit 140 in advance. The fourth map is map data indicating a relationship between the diagnosis unevenness α and the diagnosis value reliability G. FIG. 13 is a diagram illustrating an example of the fourth map. As illustrated in FIG. 13, the fourth map is set such that the diagnosis value reliability G is "1" when the value of the diagnosis unevenness α is in a range from "0" to a first threshold value α1. The fourth map is set such that the diagnosis value reliability G is "0" when the value of the diagnosis unevenness α is equal to or greater than a second threshold value α2. The second threshold value α2 is greater than the first threshold value α1. In addition, the fourth map is set such that the diagnosis value reliability G decreases in inverse proportion to the diagnosis unevenness α when the value of the diagnosis unevenness α is in a range from the first threshold value α1 to the second threshold value α2. The reliability evaluating unit 132 acquires the diagnosis value reliability G corresponding to the calculated diagnosis unevenness α from the fourth map set as described above.

Examples of the method of sampling the combined data 146 in a plurality of different patterns include a method of sampling the combined data 146 through sampling with replacement or sampling without replacement, a method of randomly sampling the combined data 146, a method of selecting a capacity section and sampling the combined data 146, a method of selecting a voltage section and sampling the combined data 146, and a method of sampling the combined data 146 at different sampling rates. For example, the reliability evaluating unit 132 may sample the combined data 146 through random sampling with replacement. For example, the reliability evaluating unit 132 may randomly select a section through sampling without replacement out of the capacity sections I1, I2, I3, ... illustrated in FIG. 8 and sample the combined data 146 included in the selected section. For example, the reliability evaluating unit 132 may sample the combined data 146 while changing the sampling rate from 50% to 80% by 5%.

As described above, the reliability evaluating unit 132 acquires a plurality of sample groups by randomly sampling some of the combined data 146, calculates a plurality of SOH diagnosis values on the basis of the acquired plurality of sample groups, and sets the reliability (the diagnosis value reliability G) to a lower value as the evenness (the diagnosis unevenness α) of the plurality of SOH diagnosis values become larger.

Three examples of the method of calculating the diagnosis value reliability G have been described hitherto. When the diagnosis value reliability G is calculated using one of the three examples, the reliability evaluating unit 132 stores the calculated diagnosis value reliability G in the storage unit 140 in correlation with a date and time at which the OCV curve 152 has been acquired. Accordingly, as illustrated in FIG. 2, the reliability time-series data 156 which is time-series data of the diagnosis value reliability G is stored in the storage unit 140.

The SOH diagnosis value correcting unit 133 corresponds to a deterioration state determining unit configured to determine a final index value (a corrected SOH diagnosis value) on the basis of the diagnosis value reliability G. Specifically, the SOH diagnosis value correcting unit 133 calculates a corrected SOH diagnosis value which is a corrected value of the SOH diagnosis value by correcting the SOH diagnosis value calculated by the SOH diagnosis value calculating unit 131 on the basis of the diagnosis value reliability G calculated by the reliability evaluating unit 132.

Figure 14:
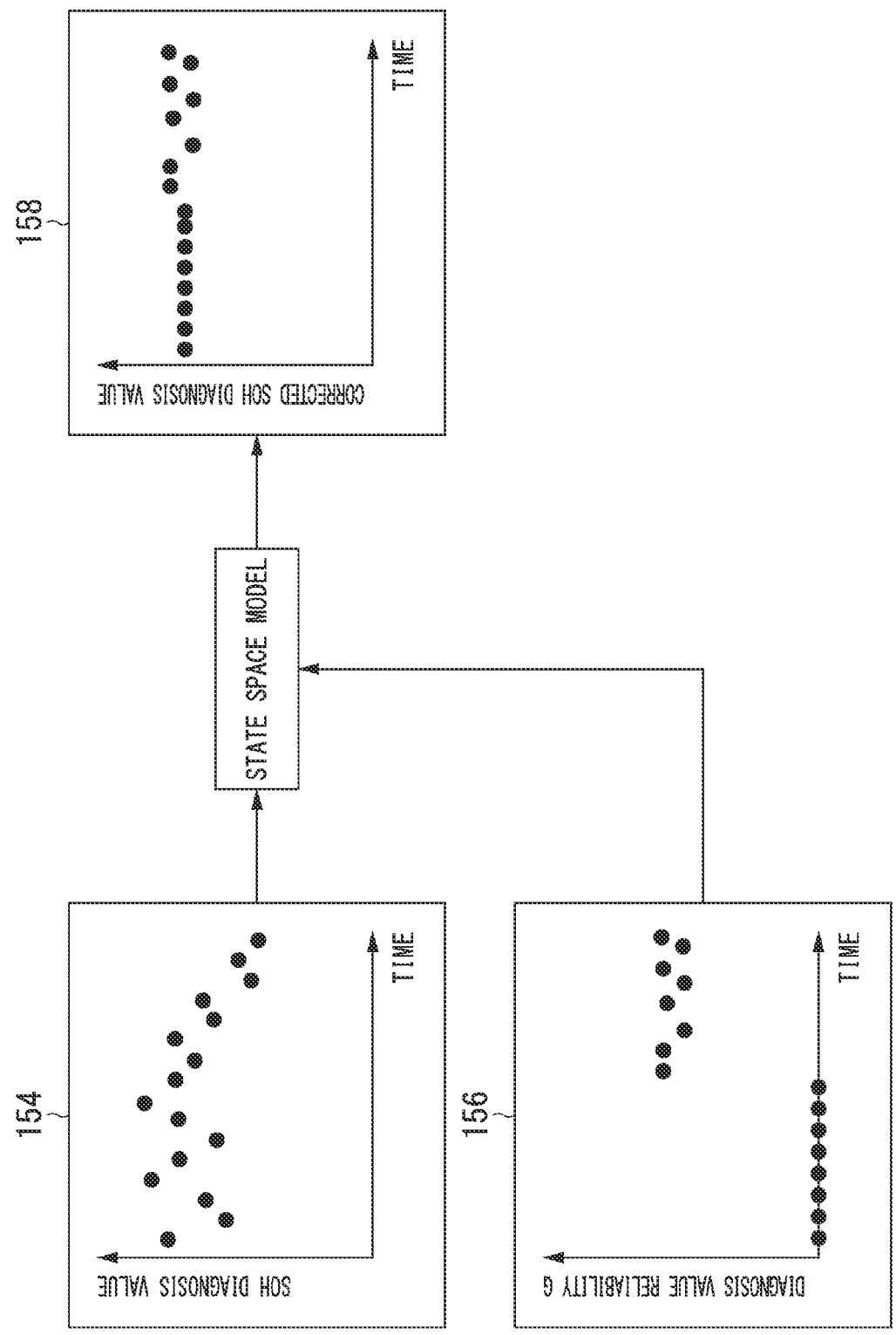
FIG. 14 is a diagram illustrating an SOH diagnosis value correcting process which is performed by an SOH diagnosis value correcting unit 133.

FIG. 14 is a diagram illustrating the process of correcting an SOH diagnosis value which is performed by the SOH diagnosis value correcting unit 133. As illustrated in FIG. 14, the SOH diagnosis value correcting unit 133 calculates the corrected SOH diagnosis value by extracting a pair of the SOH diagnosis value and the diagnosis value reliability G correlated with the same date and time out of the SOH diagnosis values included in the SOH time-series data 154 and the diagnosis value reliabilities G included in the reliability time-series data 156 and inputting the extracted pair of the SOH diagnosis value and the diagnosis value reliability G to a state space model expressed by Expression (5). In Expression (5), y1 denotes the corrected SOH diagnosis value, B1 denotes the SOH diagnosis value extracted from the SOH time-series data 154, G denotes the diagnosis value reliability G extracted from the reliability time-series data 156, and A1 denotes a corrected SOH diagnosis value which was previously calculated. For example, A1 is an immediately previous value out of the corrected SOH diagnosis values which were previously calculated.

$$y1 = A1 \times (1-G) + B1 \times G \qquad (5)$$

As described above, the SOH diagnosis value correcting unit 133 determines a final parameter (y1) by adding a newest parameter (B1) and the predicted index value (A1) based on a previous parameter at predetermined proportions corresponding to the reliability (G).

The SOH diagnosis value correcting unit 133 calculates the corrected SOH diagnosis values corresponding to date and times from the most previous date and time to the current date and time by repeatedly performing the correction process using a pair of the SOH diagnosis value and the diagnosis value reliability G correlated with each date and time from the most previous date and time to the newest date and time (that is, the current date and time). When the corrected SOH diagnosis values are calculated as described above, the SOH diagnosis value correcting unit 133 stores the calculated corrected SOH diagnosis values in the storage unit 140 in correlation with the same date and times as the extracted pair of the SOH diagnosis value and the diagnosis value reliability G. Accordingly, as illustrated in FIGS. 2 and 14, corrected SOH time-series data 158 which is time-series data of the corrected SOH diagnosis value is stored in the storage unit 140.

[Flow of Operations]

Figure 15:
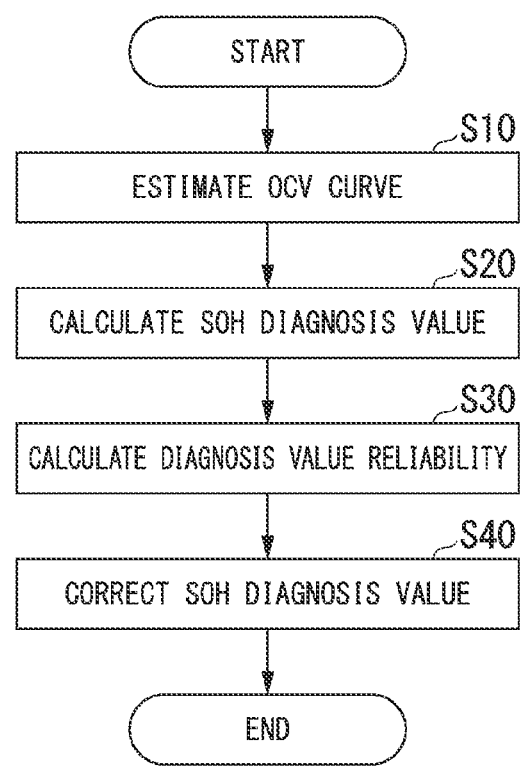
FIG. 15 is a flowchart illustrating an example of a routine of processes which is performed by the battery state diagnosing device 100.

A routine of processes which is performed by the battery state diagnosing device 100 will be described below with reference to FIG. 15. FIG. 15 is a flowchart illustrating an example of the routine of processes which is performed by the battery state diagnosing device 100. As illustrated in FIG. 15, first, the battery state diagnosing device 100 estimates an OCV curve 152 (Step S10). The battery state diagnosing device 100 estimates the OCV curve 152 by performing the routine of the flowchart illustrated in FIG. 16 in Step S10.

Figure 16:
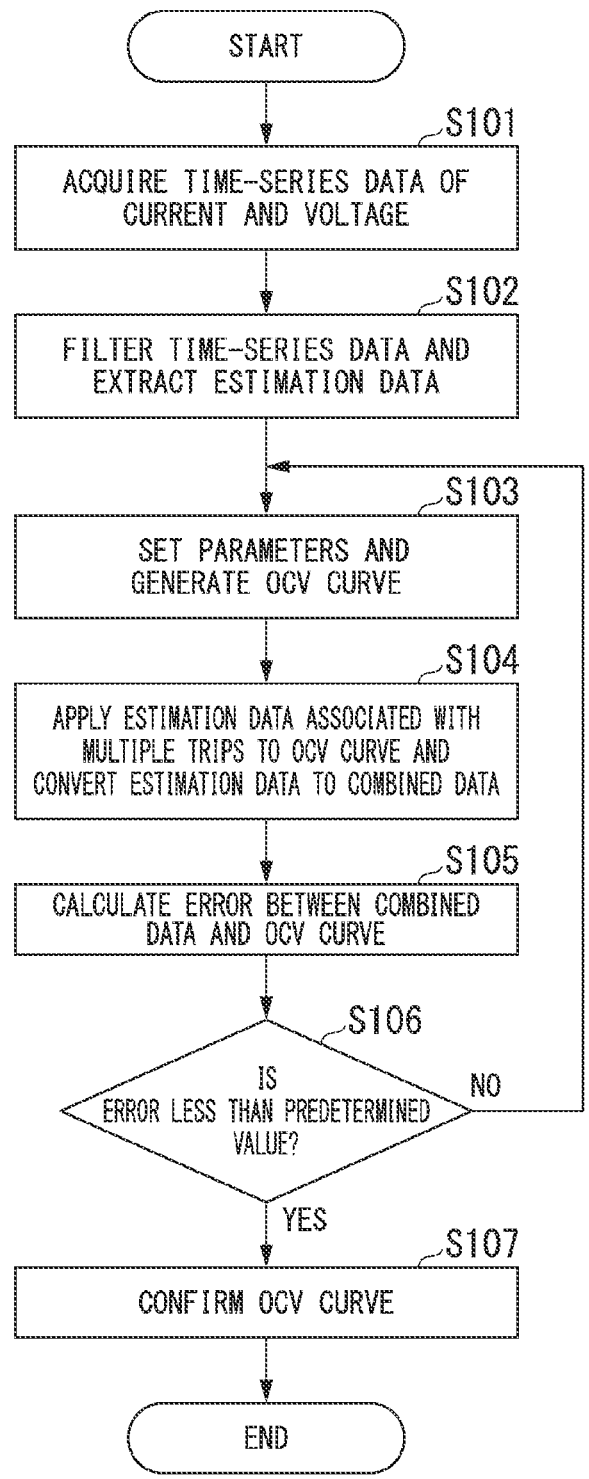
FIG. 16 is a flowchart illustrating an example of a routine of processes of estimating the OCV curve 152 which is performed by the battery state diagnosing device 100.

FIG. 16 is a flowchart illustrating an example of a routine of processes of estimating the OCV curve 152 which is performed by the battery state diagnosing device 100. The routine of the flowchart illustrated in FIG. 16 is for defining the OCV curve 152 to which the estimation data 144 associated with multiple trips of the vehicle 10 is applied as an initial OCV curve by setting the parameters of the first parameter group and the second parameter group.

As illustrated in FIG. 16, the battery state diagnosing device 100 acquires time-series data 142 including a current value and a voltage value from the vehicle 10 (Step S101). Then, the battery state diagnosing device 100 extracts estimation data 144 by filtering the time-series data 142 on the basis of the current value of the time-series data 142 and a low-current duration time measured on the basis of the acquired current value (Step S102).

Then, the battery state diagnosing device 100 generates a positive-electrode OCP curve 148 # from a reference positive-electrode OCP curve 148 and generates a negative-electrode OCP curve 150 # from a negative-electrode OCP curve 150 by arbitrarily setting parameters of the first parameter group and the second parameter group. The battery state diagnosing device 100 generates the OCV curve 152 by subtracting the negative-electrode OCP curve 150 # from the positive-electrode OCP curve 148 # (Step S103). Then, the battery state diagnosing device 100 converts the estimation data 144 to combined data 146 by fitting the estimation data 144 associated with multiple trips of the vehicle 10 to the generated OCV curve 152 (Step S104).

Then, the battery state diagnosing device 100 calculates an error between the converted combined data 146 and the generated OCV curve 152 (Step S105). Then, the battery state diagnosing device 100 determines whether the calculated error is less than a predetermined value (Step S106). When it is determined that the calculated error is not less than the predetermined value (Step S106: NO), the battery state diagnosing device 100 causes the routine to return to Step S103, resets the first parameter group and the second parameter group, and generates the OCV curve 152. On the other hand, when it is determined that the calculated error is less than the predetermined value (Step S106: YES), the battery state diagnosing device 100 confirms the OCV curve 152 as a final OCV curve 152 (Step S107). Through the aforementioned processes, the routine of the flowchart illustrated in FIG. 16 ends. When the routine of the flowchart illustrated in FIG. 16 ends, the battery state diagnosing device 100 performs Step S20 in the flowchart illustrated in FIG. 15.

As illustrated in FIG. 15, when the OCV curve 152 has been estimated in Step S10, the battery state diagnosing device 100 calculates an SOH diagnosis value on the basis of the estimated OCV curve 152 (Step S20). For example, the battery state diagnosing device 100 calculates a difference between a dischargeable capacity at a fully charged voltage and a dischargeable capacity at a fully discharged voltage as a fully charged capacity FCC on the basis of the OCV curve 152. Then, the battery state diagnosing device 100 calculates the SOH diagnosis value by substituting the calculated fully charged capacity FCC and the initial fully charged capacity FCC0 of the battery 40 into Expression (3). The battery state diagnosing device 100 stores the calculated SOH diagnosis value in the storage unit 140 in correlation with a date and time at which the OCV curve 152 has been acquired. Accordingly, SOH time-series data 154 which is time-series data of the SOH diagnosis value is stored in the storage unit 140.

Then, the battery state diagnosing device 100 calculates a diagnosis value reliability G on the basis of the combined data 146 and the OCV curve 152 (Step S30). For example, the battery state diagnosing device 100 calculates the diagnosis value reliability G using one of the first example, the second example, and the third example. When the diagnosis value reliability G is calculated, the battery state diagnosing device 100 stores the calculated diagnosis value reliability G in the storage unit 140 in correlation with the date and time at which the OCV curve 152 has been acquired. Accordingly, reliability time-series data 156 which is time-series data of the diagnosis value reliability G is stored in the storage unit 140.

Then, the battery state diagnosing device 100 calculates a corrected SOH diagnosis value which is a corrected value of the SOH diagnosis value by correcting the SOH diagnosis value calculated in Step S20 on the basis of the diagnosis value reliability G calculated in Step S30 (Step S40). For example, the battery state diagnosing device 100 calculates the corrected SOH diagnosis value by extracting a pair of the SOH diagnosis value and the diagnosis value reliability G correlated with the same date and time out of the SOH diagnosis values included in the SOH time-series data 154 and the diagnosis value reliabilities G included in the reliability time-series data 156 and inputting the extracted pair of the SOH diagnosis value and the diagnosis value reliability G to a state space model expressed by Expression (5).

The battery state diagnosing device 100 calculates the corrected SOH diagnosis values corresponding to date and times from the most previous date and time to the current date and time by repeatedly performing the correction process using the pairs of the SOH diagnosis value and the diagnosis value reliability G correlated with the date and times from the most previous date and time to the current date and time. When the corrected SOH diagnosis values are calculated as described above, the battery state diagnosing device 100 stores the calculated corrected SOH diagnosis values in the storage unit 140 in correlation with the same date and times as the extracted pair of the SOH diagnosis value and the diagnosis value reliability G. Accordingly, corrected SOH time-series data 158 which is time-series data of the corrected SOH diagnosis value is stored in the storage unit 140. Through the aforementioned processes, the routine of the flowchart illustrated in FIG. 15 ends.

As described above, the battery state diagnosing device 100 according to the first embodiment estimates the SOH diagnosis value as an index value associated with the deterioration state of the battery 40 on the basis of the time-series data 142 including at least a current value and a voltage value of the battery 40, evaluates the diagnosis value reliability G of the SOH diagnosis value on the basis of at least one of distribution information of the voltage value included in the combined data 146 and distribution information of the dischargeable capacity calculated using the current value included in the combined data 146, and determines the SOH diagnosis value corrected on the basis of the diagnosis value reliability G (the corrected SOH diagnosis value) as a final parameter. Accordingly, it is possible to enhance estimation accuracy of the SOH diagnosis value which is an index value associated with the deterioration state of the battery 40.

The battery state diagnosing device 100 according to the first embodiment may further include a reliability updating unit configured to update the reliability to a lower value when a difference between the newest index value and a representative value of the previous index values is equal to or greater than a threshold value. In this way, when the newest index value is very far from the representative value of the previous index values (for example, an average value of the index values from a date and time a predetermined period ago to the current date and time), trackability of the estimation algorithm to the data is decreased by decreasing the reliability.

Second Embodiment

A battery state diagnosing device 100A according to a second embodiment of the present invention will be described below.

[Configuration of Battery State Diagnosing Device 100A]

Figure 17:
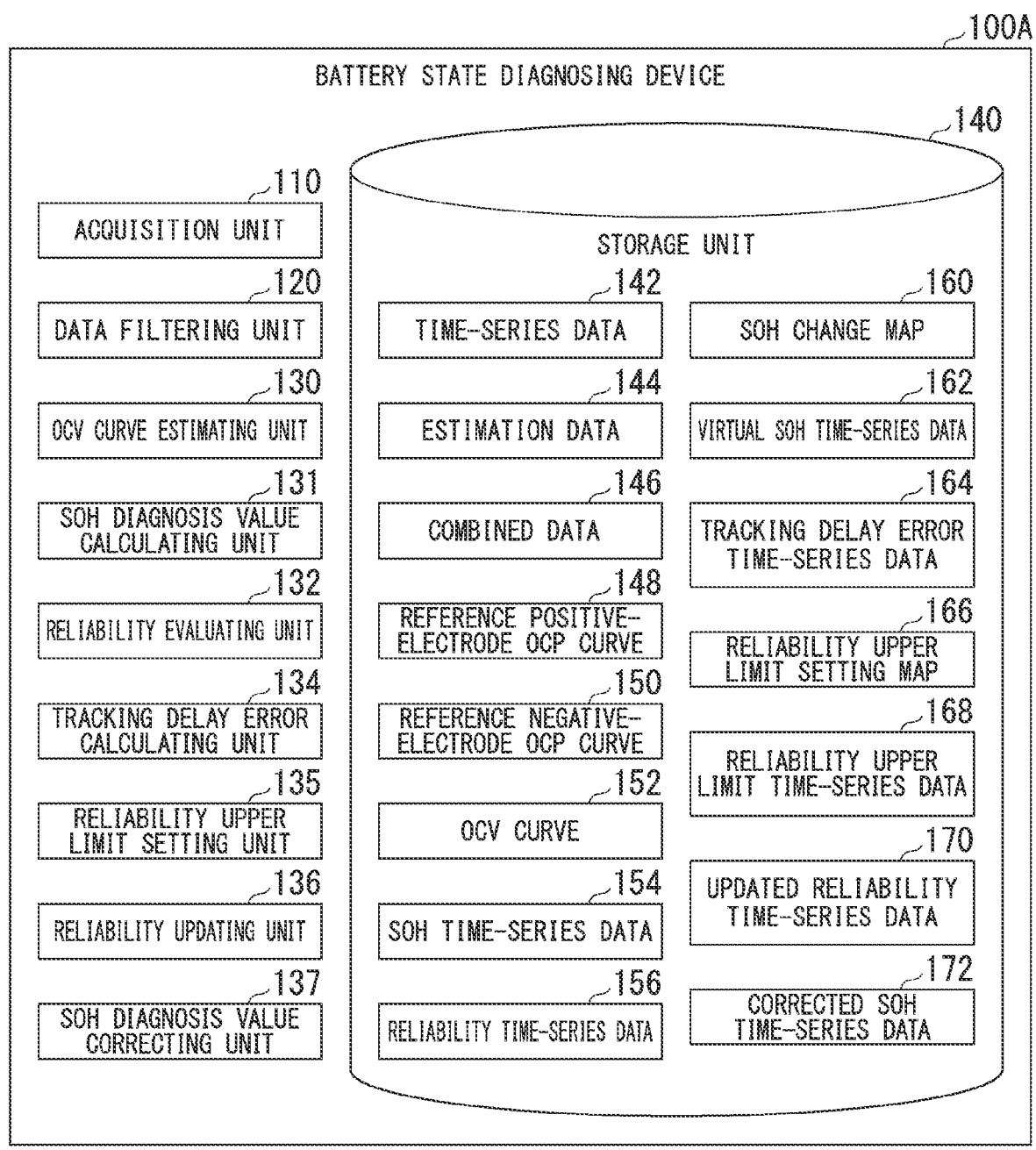
FIG. 17 is a diagram illustrating an example of a configuration of a battery state diagnosing device 100A according to a second embodiment.

FIG. 17 is a diagram illustrating an example of a configuration of the battery state diagnosing device 100A according to the second embodiment. In the following description, the same elements provided in the battery state diagnosing device 100A according to the second embodiment as the elements provided in the battery state diagnosing device 100 according to the first embodiment will be referred to by the same reference signs and description thereof will be omitted. The configuration of the vehicle 10 to which the battery state diagnosing device 100A according to the second embodiment is applied is the same as in the first embodiment, and thus description of the vehicle 10 according to the second embodiment will be omitted.

As illustrated in FIG. 17, the battery state diagnosing device 100A includes a tracking delay error calculating unit 134, a reliability upper limit setting unit 135, and a reliability updating unit 136 in addition to the elements provided in the battery state diagnosing device 100. The battery state diagnosing device 100A includes an SOH diagnosis value correcting unit 137 instead of the SOH diagnosis value correcting unit 133 provided in the battery state diagnosing device 100.

The tracking delay error calculating unit 134 calculates a virtual SOH diagnosis value as a virtual index value on the basis of the diagnosis value reliability G and a reference deterioration change line indicating change of the SOH with respect to time and calculates a tracking delay error E which is a difference between an SOH true value calculated on the basis of the reference deterioration change line and the virtual SOH diagnosis value.

Figure 18:
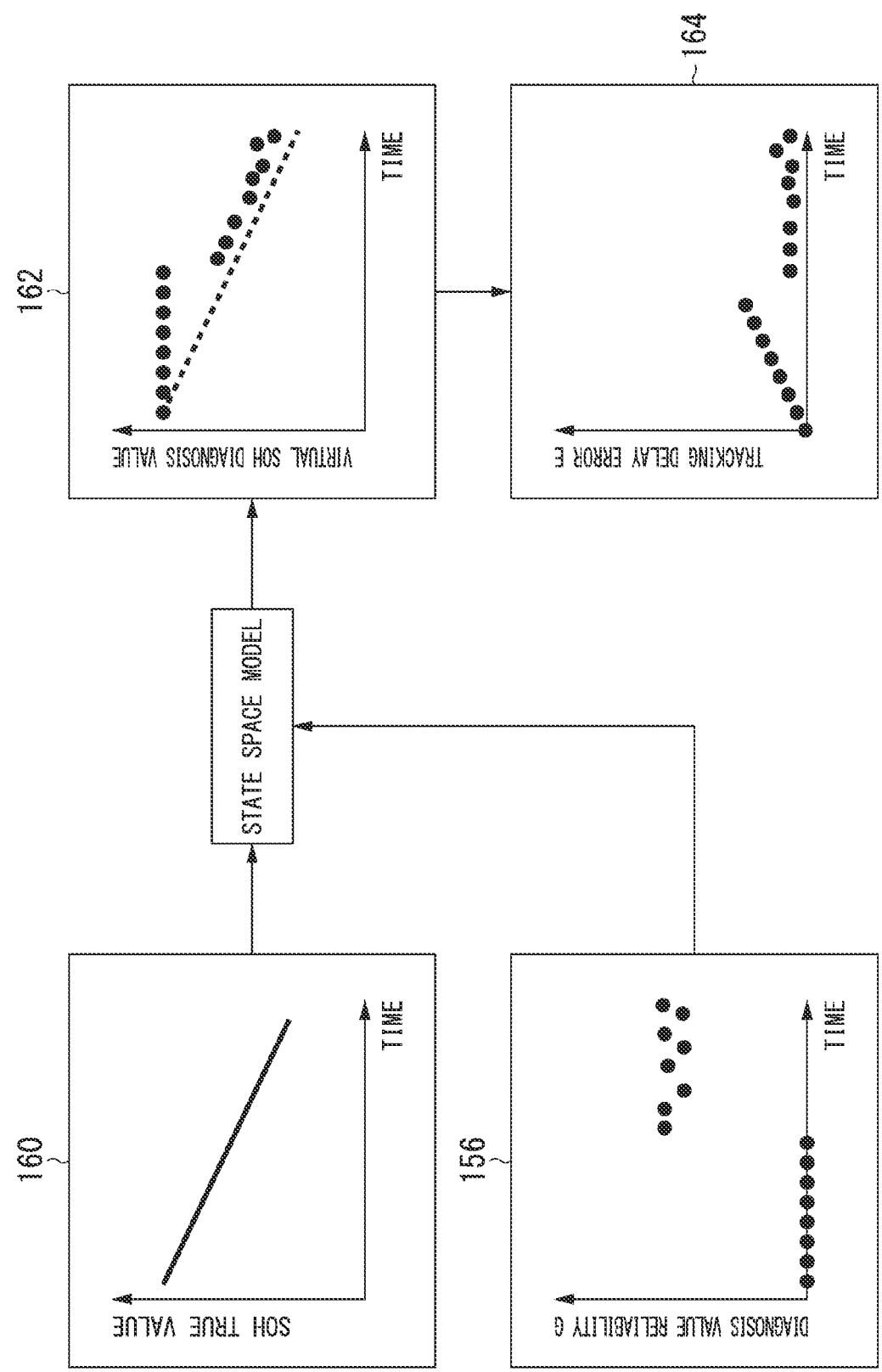
FIG. 18 is a diagram illustrating a process of calculating a tracking delay error E which is performed by a tracking delay error calculating unit 134.

Specifically, the tracking delay error calculating unit 134 virtually calculates the SOH diagnosis value on the basis of the diagnosis value reliability G calculated by the reliability evaluating unit 132 and an SOH change map 160 stored in the storage unit 140 in advance and calculates a difference between the virtually calculated SOH diagnosis value (virtual SOH diagnosis value) and the SOH true value as the tracking delay error E. FIG. 18 is a diagram illustrating a process of calculating the tracking delay error E which is performed by the tracking delay error calculating unit 134. The SOH change map 160 is a map data indicating the reference deterioration change line acquired in advance by experiment or the like.

As illustrated in FIG. 18, the tracking delay error calculating unit 134 extracts the diagnosis value reliability G correlated with an arbitrary date and time out of the diagnosis value reliabilities G included in the reliability time-series data 156 and acquires the SOH true value at the same date and time as the extracted diagnosis value reliability G from the SOH change map 160. Then, the tracking delay error calculating unit 134 calculates the virtual SOH diagnosis value by inputting a pair of the diagnosis value reliability G extracted from the reliability time-series data 156 and the SOH true value acquired from the SOH change map 160 to a state space model expressed by Expression (6). In Expression (6), y2 denotes the virtual SOH diagnosis value, B2 denotes the SOH true value acquired from the SOH change map 160, G denotes the diagnosis value reliability G extracted from the reliability time-series data 156, and A2 denotes a virtual SOH diagnosis value which was previously calculated. For example, A2 is an immediately previous value out of the virtual SOH diagnosis values which were previously calculated.

$$y2 = A2 \times (1-G) + B2 \times G \quad (6)$$

The tracking delay error calculating unit 134 calculates the virtual SOH diagnosis values at date and times from the most previous date and time to the current date and time by repeatedly performing the aforementioned process using the pairs of the SOH true value and the diagnosis value reliability G at the date and times from the most previous date and time to the newest date and time (that is, the current date and time). When the virtual SOH diagnosis value is calculated as described above, the tracking delay error calculating unit 134 stores the calculated virtual SOH diagnosis value in the storage unit 140 in correlation with the same date and time as the pair of the SOH true value and the diagnosis value reliability G. Accordingly, as illustrated in FIGS. 17 and 18, virtual SOH time-series data 162 which is time-series data of the virtual SOH diagnosis value is stored in the storage unit 140.

Then, the tracking delay error calculating unit 134 extracts the virtual SOH diagnosis value correlated with an arbitrary date and time out of the virtual SOH diagnosis values included in the virtual SOH time-series data 162 and acquires the SOH true value at the same date and time as the extracted virtual SOH diagnosis value from the SOH change map 160. Then, the tracking delay error calculating unit 134 calculates the tracking delay error E by subtracting the SOH true value acquired from the SOH change map 160 from the virtual SOH diagnosis value extracted from the virtual SOH time-series data 162.

The tracking delay error calculating unit 134 calculates the tracking delay error E at the date and times from the most previous date and time to the current date and time by repeatedly performing the subtraction process using the pairs of the virtual SOH diagnosis value and the SOH true value at the date and times from the most previous date and time to the current date and time. When the tracking delay error E is calculated as described above, the tracking delay error calculating unit 134 stores the calculated tracking delay error E in the storage unit 140 in correlation with the same date and time as the pair of the virtual SOH diagnosis value and the SOH true value. Accordingly, as illustrated in FIGS. 17 and 18, tracking delay error time-series data 164 which is time-series data of the tracking delay error E is stored in the storage unit 140.

Figure 19:
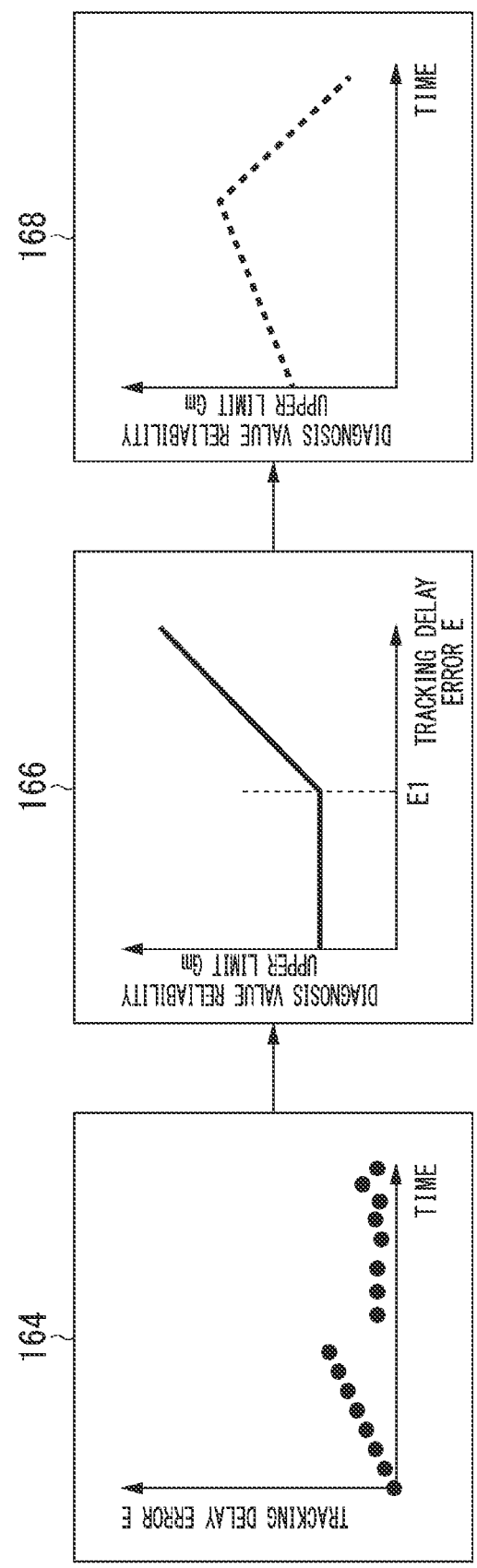
FIG. 19 is a diagram illustrating a process of setting a diagnosis value reliability upper limit Gm which is performed by a reliability upper limit setting unit 135.

The reliability upper limit setting unit 135 sets a diagnosis value reliability upper limit Gm which is an upper limit of the diagnosis value reliability G on the basis of the tracking delay error E calculated by the tracking delay error calculating unit 134 and a reliability upper limit setting map 166 stored in advance in the storage unit 140. FIG. 19 is a diagram illustrating a process of setting the diagnosis value reliability upper limit Gm which is performed by the reliability upper limit setting unit 135. As illustrated in FIG. 19, the reliability upper limit setting map 166 is map data indicating a relationship between the tracking delay error E and the diagnosis value reliability upper limit Gm. The reliability upper limit setting map 166 is set such that the diagnosis value reliability upper limit Gm reaches a predetermined value when the value of the tracking delay error E is equal to or less than a predetermined threshold value E1. The reliability upper limit setting map 166 is set such that the diagnosis value reliability upper limit Gm increases in proportion to the tracking delay error E when the value of the tracking delay error E is greater than the threshold value E1. In this way, the reliability upper limit setting unit 135 sets the diagnosis value reliability upper limit Gm to a greater value as the tracking delay error E becomes larger.

As illustrated in FIG. 19, the reliability upper limit setting unit 135 extracts the tracking delay error E correlated with an arbitrary date and time out of the tracking delay errors E included in the tracking delay error time-series data 164 and acquires the diagnosis value reliability upper limit Gm corresponding to the extracted tracking delay error E from the reliability upper limit setting map 166. Then, the reliability upper limit setting unit 135 calculates the diagnosis value reliability upper limit Gm at the date and times from the most previous date and time to the current date and time by repeatedly performing the setting process using the tracking delay errors E at the date and times from the most previous date and time to the current date and time. When the diagnosis value reliability upper limit Gm is acquired as described above, the reliability upper limit setting unit 135 stores the acquired diagnosis value reliability upper limit Gm in the storage unit 140 in correlation with the same date and time as the extracted tracking delay error E. Accordingly, as illustrated in FIGS. 17 and 19, reliability upper limit time-series data 168 which is time-series data of the diagnosis value reliability upper limit Gm is stored in the storage unit 140.

Figure 20:
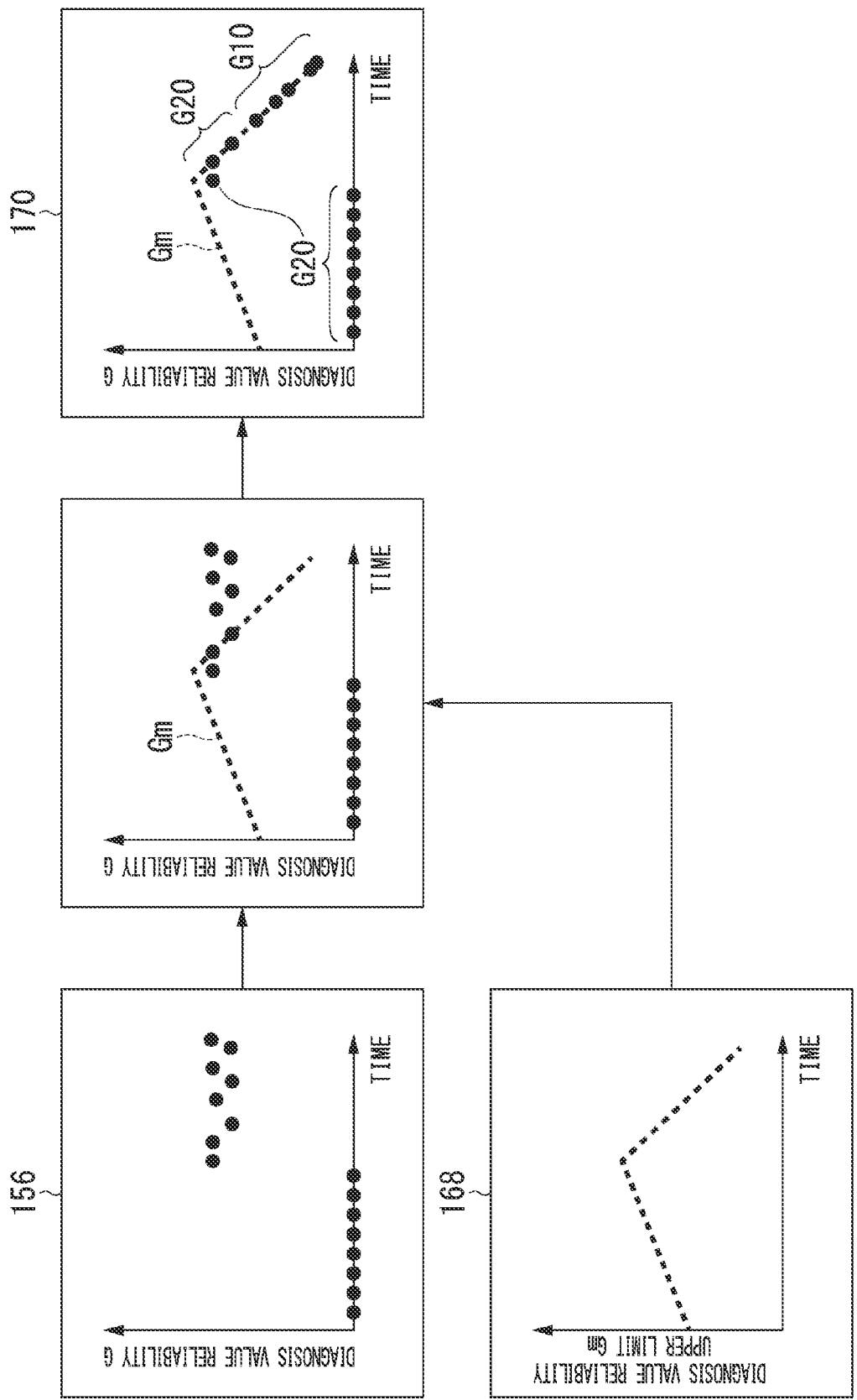
FIG. 20 is a diagram illustrating a process of updating a diagnosis value reliability G which is performed by a reliability updating unit 136.

The reliability updating unit 136 updates the diagnosis value reliability G on the basis of the diagnosis value reliability upper limit Gm set by the reliability upper limit setting unit 135. FIG. 20 is a diagram illustrating a process of updating the diagnosis value reliability G which is performed by the reliability updating unit 136. As illustrated in FIG. 20, the reliability updating unit 136 extracts a pair of the diagnosis value reliability G and the diagnosis value reliability upper limit Gm correlated with the same date and time out of pairs of the diagnosis value reliabilities G included in the reliability time-series data 156 and the diagnosis value reliability upper limits Gm included in the reliability upper limit time-series data 168 and determines whether the diagnosis value reliability G is greater than the diagnosis value reliability upper limit Gm.

When the diagnosis value reliability G is greater than the diagnosis value reliability upper limit Gm, the reliability updating unit 136 updates the diagnosis value reliability G to the same value as the diagnosis value reliability upper limit Gm. On the other hand, when the diagnosis value reliability G is equal to or less than the diagnosis value reliability upper limit Gm, the reliability updating unit 136 does not update the diagnosis value reliability G. In the following description, the diagnosis value reliability G updated to the same value as the diagnosis value reliability upper limit Gm is referred to as an updated diagnosis value reliability G10, and the non-updated diagnosis value reliability G may be referred to as a non-updated diagnosis value reliability G20.

The reliability updating unit 136 acquires the updated diagnosis value reliability G10 or the non-updated diagnosis value reliability G20 at the date and times from the most previous date and time to the current date and time by repeatedly performing the updating process using the pairs of diagnosis value reliability G and the diagnosis value reliability upper limit Gm correlated with the date and times from the most previous date and time to the current date and time and stores the acquired updated diagnosis value reliability G10 or non-updated diagnosis value reliability G20 in the storage unit 140 in correlation with the same date and time as the extracted pair of the diagnosis value reliability G and the diagnosis value reliability upper limit Gm. Accordingly, as illustrated in FIGS. 17 and 20, updated reliability time-series data 170 which is time-series data including at least one of the updated diagnosis value reliability G10 and the non-updated diagnosis value reliability G20 is stored in the storage unit 140.

The SOH diagnosis value correcting unit 137 corresponds to a deterioration state determining unit configured to determine a final index value (a corrected SOH diagnosis value) on the basis of the updated diagnosis value reliability G. Specifically, the SOH diagnosis value correcting unit 137 calculates the corrected SOH diagnosis value which is a corrected value of the SOH diagnosis value by correcting the SOH diagnosis value calculated by the SOH diagnosis value calculating unit 131 on the basis of the diagnosis value reliability G updated by the reliability updating unit 136.

Figure 21:
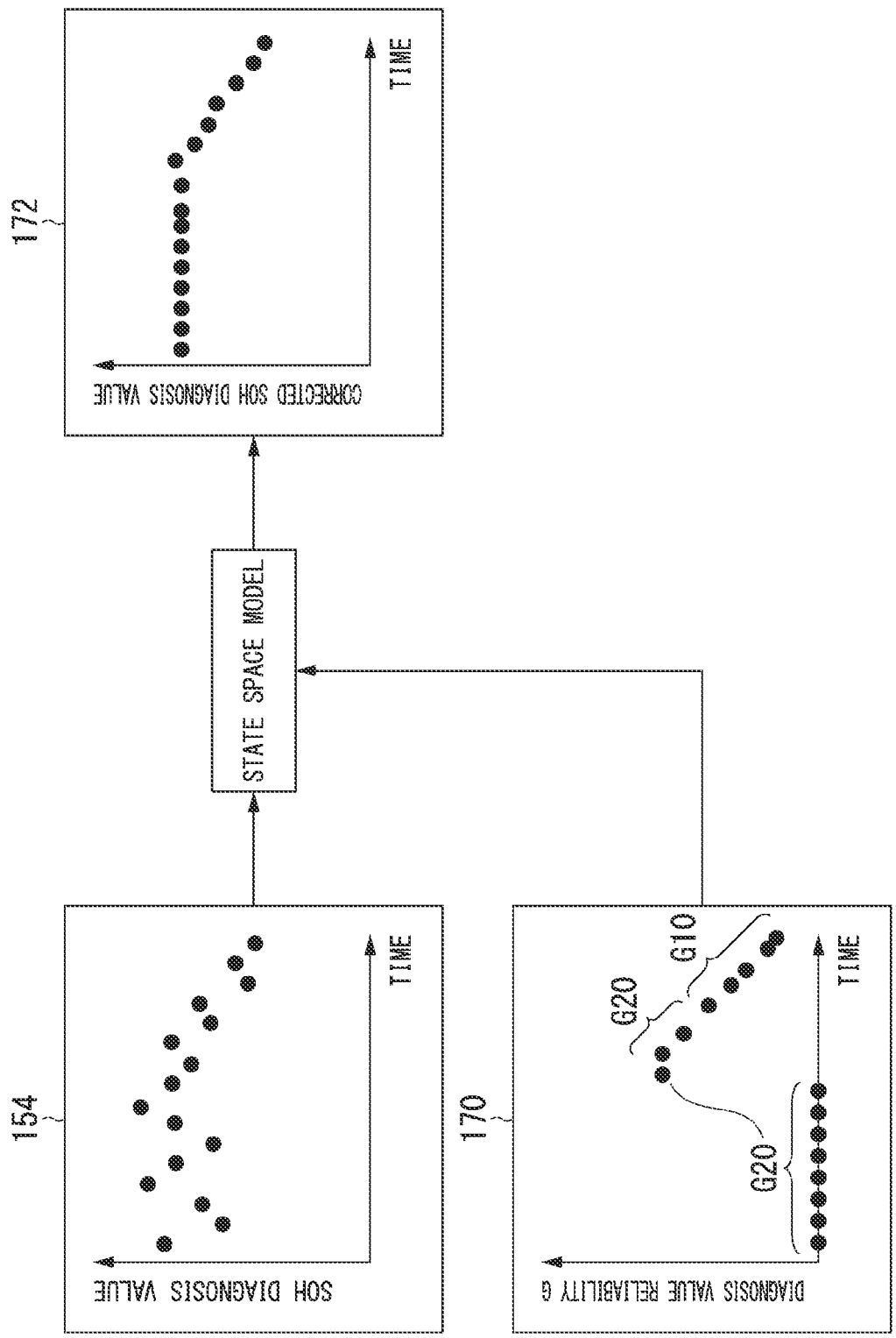
FIG. 21 is a diagram illustrating an SOH diagnosis value correcting process which is performed by an SOH diagnosis value correcting unit 137.

FIG. 21 is a diagram illustrating a process of correcting the SOH diagnosis value which is performed by the SOH diagnosis value correcting unit 137. As illustrated in FIG. 21, the SOH diagnosis value correcting unit 137 extracts a pair of the SOH diagnosis value and the diagnosis value reliability G correlated with the same date and time out of the SOH diagnosis values included in the SOH time-series data 154 and the diagnosis value reliabilities G included in the updated reliability time-series data 170 and calculates the corrected SOH diagnosis value by inputting the extracted pair of the SOH diagnosis value and the diagnosis value reliability G to a state space model expressed by Expression (7). In Expression (7), y3 denotes the corrected SOH diagnosis value, B3 denotes the SOH diagnosis value extracted from the SOH time-series data 154, G' denotes the diagnosis value reliability G extracted from the updated reliability time-series data 170 (the updated diagnosis value reliability G10 or the non-updated diagnosis value reliability G20), and A3 denotes a corrected SOH diagnosis value which was previously calculated. For example, A3 is an immediately previous value out of the corrected SOH diagnosis values which were previously calculated.

$$y3 = A3 \times (1-G') + B3 \times G' \qquad (7)$$

The SOH diagnosis value correcting unit 137 calculates the corrected SOH diagnosis values corresponding to the date and times from the most previous date and time to the current date and time by repeatedly performing the aforementioned correction process using the pairs of the SOH diagnosis value and the diagnosis value reliability G correlated with the date and times from the most previous date and time to the newest date and time. When the corrected SOH diagnosis value is calculated as described above, the SOH diagnosis value correcting unit 137 stores the calculated corrected SOH diagnosis value in the storage unit 140 in correlation with the same date and time as the extracted pair of the SOH diagnosis value and the diagnosis value reliability G. Accordingly, as illustrated in FIGS. 17 and 21, corrected SOH time-series data 172 which is time-series data of the corrected SOH diagnosis value calculated by the SOH diagnosis value correcting unit 137 is stored in the storage unit 140.

[Flow of Operations]

Figure 22:
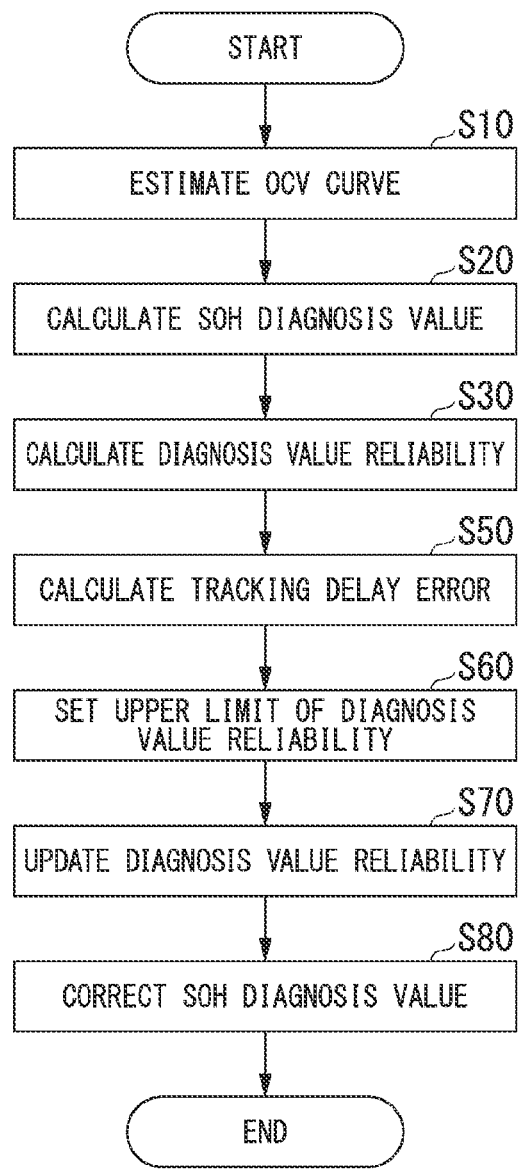
FIG. 22 is a flowchart illustrating an example of a routine of processes which is performed by the battery state diagnosing device 100A.

A routine of processes which is performed by the battery state diagnosing device 100A according to the second embodiment will be described below with reference to FIG. 22. FIG. 22 is a flowchart illustrating an example of the routine of processes which is performed by the battery state diagnosing device 100A. As illustrated in FIG. 22, first, the battery state diagnosing device 100A estimates an OCV curve 152 (Step S10). The process of Step S10 performed by the battery state diagnosing device 100A according to the second embodiment is the same as the process of Step S10 performed by the battery state diagnosing device 100 according to the first embodiment. That is, the battery state diagnosing device 100A estimates the OCV curve 152 by performing the routine of the flowchart illustrated in FIG. 16 in Step S10. Description of the flowchart illustrated in FIG. 16 will be omitted. When the routine of the flowchart illustrated in FIG. 16 ends, the battery state diagnosing device 100A causes the routine to proceed to Step S20 in the flowchart illustrated in FIG. 22.

As illustrated in FIG. 22, when the OCV curve 152 has been estimated in Step S10, the battery state diagnosing device 100A calculates an SOH diagnosis value on the basis of the estimated OCV curve 152 (Step S20). The process of Step S20 performed by the battery state diagnosing device 100A according to the second embodiment is the same as the process of Step S20 performed by the battery state diagnosing device 100 according to the first embodiment, and thus description of Step S20 will be omitted.

Then, the battery state diagnosing device 100A calculates a diagnosis value reliability G on the basis of the combined data 146 and the OCV curve 152 (Step S30). The process of Step S30 performed by the battery state diagnosing device 100A according to the second embodiment is the same as the process of Step S30 performed by the battery state diagnosing device 100 according to the first embodiment, and thus description of Step S30 will be omitted.

Then, the battery state diagnosing device 100A calculates a virtual SOH diagnosis value on the basis of the diagnosis value reliability G calculated in Step S30 and the SOH change map 160 stored in advance in the storage unit 140 and calculates a difference between the virtual SOH diagnosis value and an SOH true value as the tracking delay error E (Step S50). For example, the battery state diagnosing device 100A extracts the diagnosis value reliability G correlated with an arbitrary date and time out of the diagnosis value reliabilities G included in the reliability time-series data 156 and acquires the SOH true value at the same date and time as the extracted diagnosis value reliability G from the SOH change map 160. Then, the battery state diagnosing device 100A calculates the virtual SOH diagnosis value by inputting a pair of the diagnosis value reliability G extracted from the reliability time-series data 156 and the SOH true value acquired from the SOH change map 160 to a state space model expressed by Expression (6).

The battery state diagnosing device 100A calculates the virtual SOH diagnosis values at the date and times from the most previous date and time to the current date and time by repeatedly performing the aforementioned process using the pairs of the SOH true value and the diagnosis value reliability G at the date and times from the most previous date and time to the current date and time. When the virtual SOH diagnosis value is calculated as described above, the battery state diagnosing device 100A stores the calculated virtual SOH diagnosis value in the storage unit 140 in correlation with the same date and time as the pair of the SOH true value and the diagnosis value reliability G. Accordingly, virtual SOH time-series data 162 which is time-series data of the virtual SOH diagnosis value is stored in the storage unit 140.

Then, the battery state diagnosing device 100A extracts the virtual SOH diagnosis value correlated with an arbitrary date and time out of the virtual SOH diagnosis values included in the virtual SOH time-series data 162 and acquires the SOH true value at the same date and time as the extracted virtual SOH diagnosis value from the SOH change map 160. Then, the battery state diagnosing device 100A calculates the tracking delay error E by subtracting the SOH true value acquired from the SOH change map 160 from the virtual SOH diagnosis value extracted from the virtual SOH time-series data 162.

The battery state diagnosing device 100A calculates the tracking delay errors E at the date and times from the most previous date and time to the current date and time by repeatedly performing the subtraction process using the pairs of the virtual SOH diagnosis value and the SOH true value at the date and times from the most previous date and time to the current date and time. When the tracking delay error E is calculated as described above, the battery state diagnosing device 100A stores the calculated tracking delay error E in the storage unit 140 in correlation with the same date and time as the pair of the virtual SOH diagnosis value and the SOH true value. Accordingly, tracking delay error time-series data 164 which is time-series data of the tracking delay error E is stored in the storage unit 140.

Then, the battery state diagnosing device 100A sets a diagnosis value reliability upper limit Gm which is an upper limit of the diagnosis value reliability G on the basis of the tracking delay error E calculated in Step S50 and a reliability upper limit setting map 166 stored in advance in the storage unit 140 (Step S60). For example, the battery state diagnosing device 100A extracts the tracking delay error E correlated with an arbitrary date and time out of the tracking delay errors E included in the tracking delay error time-series data 164 and acquires the diagnosis value reliability upper limit Gm corresponding to the extracted tracking delay error E from the reliability upper limit setting map 166.

Then, the battery state diagnosing device 100A acquires the diagnosis value reliability upper limit Gm at the date and times from the most previous date and time to the current date and time by repeatedly performing the setting process using the tracking delay errors E at the date and times from the most previous date and time to the current date and time. When the diagnosis value reliability upper limit Gm is acquired as described above, the battery state diagnosing device 100A stores the acquired diagnosis value reliability upper limit Gm in the storage unit 140 in correlation with the same date and time as the extracted tracking delay error E. Accordingly, reliability upper limit time-series data 168 which is time-series data of the diagnosis value reliability upper limit Gm is stored in the storage unit 140.

Then, the battery state diagnosing device 100A updates the diagnosis value reliability G on the basis of the diagnosis value reliability upper limit Gm set in Step S60 (Step S70). For example, the battery state diagnosing device 100A extracts a pair of the diagnosis value reliability G and the diagnosis value reliability upper limit Gm correlated with the same date and time out of the diagnosis value reliabilities G included in the reliability time-series data 156 and the diagnosis value reliability upper limits Gm included in the reliability upper limit time-series data 168 and determines whether the diagnosis value reliability G is greater than the diagnosis value reliability upper limit Gm. When the diagnosis value reliability G is greater than the diagnosis value reliability upper limit Gm, the battery state diagnosing device 100A updates the diagnosis value reliability G to the same value as the diagnosis value reliability upper limit Gm. On the other hand, when the diagnosis value reliability G is equal to or less than the diagnosis value reliability upper limit Gm, the battery state diagnosing device 100A does not update the diagnosis value reliability G.

The battery state diagnosing device 100A acquires the updated diagnosis value reliability G10 or the non-updated diagnosis value reliability G20 at the date and times from the most previous date and time to the current date and time by repeatedly performing the updating process using the pairs of diagnosis value reliability G and the diagnosis value reliability upper limit Gm correlated with the date and times from the most previous date and time to the current date and time and stores the acquired updated diagnosis value reliability G10 or non-updated diagnosis value reliability G20 in the storage unit 140 in correlation with the same date and time as the extracted pair of the diagnosis value reliability G and the diagnosis value reliability upper limit Gm. Accordingly, updated reliability time-series data 170 which is time-series data including at least one of the updated diagnosis value reliability G10 and the non-updated diagnosis value reliability G20 is stored in the storage unit 140.

Then, the battery state diagnosing device 100A calculates the corrected SOH diagnosis value which is a corrected value of the SOH diagnosis value by correcting the SOH diagnosis value calculated in Step S20 on the basis of the diagnosis value reliability G updated in Step S70 (S80). For example, the battery state diagnosing device 100A calculates the corrected SOH diagnosis value by extracting a pair of the SOH diagnosis value and the diagnosis value reliability G correlated with the same date and time out of the SOH diagnosis values included in the SOH time-series data 154 and the diagnosis value reliabilities G included in the updated reliability time-series data 170 and inputting the extracted pair of the SOH diagnosis value and the diagnosis value reliability G to the state space model expressed by Expression (7).

The battery state diagnosing device 100A calculates the corrected SOH diagnosis values corresponding to the date and times from the most previous date and time to the current date and time by repeatedly performing the aforementioned correction process using the pairs of the SOH diagnosis value and the diagnosis value reliability G correlated with the date and times from the most previous date and time to the newest date and time. When the corrected SOH diagnosis value is calculated as described above, the battery state diagnosing device 100A stores the calculated corrected SOH diagnosis value in the storage unit 140 in correlation with the same date and time as the extracted pair of the SOH diagnosis value and the diagnosis value reliability G. Accordingly, corrected SOH time-series data 172 which is time-series data of the corrected SOH diagnosis value is stored in the storage unit 140. Through the aforementioned processes, the routine of the flowchart illustrated in FIG. 22 ends.

As described above, the battery state diagnosing device 100A according to the second embodiment estimates an SOH diagnosis value as an index value associated with the deterioration state of the battery 40 on the basis of the time-series data 142 including at least a current value and a voltage value of the battery 40, evaluates a diagnosis value reliability G of the estimated SOH diagnosis value, sets a diagnosis value reliability upper limit Gm on the basis of the SOH diagnosis value and the diagnosis value reliability G, and determines the SOH diagnosis value corrected on the basis of the diagnosis value reliability G (the corrected SOH diagnosis value) which is updated on the basis of the diagnosis value reliability upper limit Gm as a final index value. Accordingly, it is possible to achieve both curbing an unevenness in the finally acquired corrected SOH diagnosis value and securing trackability of an SOH estimation algorithm to rapid change in capacity of the battery 40.

The first embodiment can be described as follows:
a battery state diagnosing device including:
a storage device storing a program; and
a hardware processor,
wherein the hardware processor is caused to execute the program stored in the storage device to perform:
acquiring time-series data including at least a current value and a voltage value of a battery;
estimating an index value associated with a deterioration state of the battery on the basis of the time-series data;
evaluating a reliability of the estimated index value on the basis of at least one of distribution information of the voltage value included in the time-series data and distribution information of a dischargeable capacity calculated using the current value included in the time-series data; and
determining a final index value on the basis of the reliability.

The second embodiment can be described as follows:
a battery state diagnosing device including:
a storage device storing a program; and
a hardware processor,
wherein the hardware processor is caused to execute the program stored in the storage device to perform:
acquiring time-series data including at least a current value and a voltage value of a battery;
estimating an index value associated with a deterioration state of the battery on the basis of the time-series data;
evaluating a reliability of the index value;
setting an upper limit of the reliability on the basis of the index value and the reliability;
updating the reliability on the basis of the upper limit; and
determining a final index value on the basis of the updated reliability.

While a mode for carrying out the present invention has been described above with reference to an embodiment, the present invention is not limited to the embodiment, and various modifications and substitutions can be performed thereon without departing from the gist of the present invention.

In the first embodiment and the second embodiment, an example in which the SOH diagnosis value is estimated as the index value associated with the deterioration state of the battery 40 and the final SOH diagnosis value (the corrected SOH diagnosis value) is determined on the basis of the diagnosis value reliability G of the SOH diagnosis value has been described above, but the present invention is not limited thereto. The first parameter group (the positive-electrode enlargement/reduction rate a and the positive-electrode shift quantity b) used to convert the reference positive-electrode OCP curve 148 to the positive-electrode OCP curve 148 # and the second parameter group (the negative-electrode enlargement/reduction rate c and the negative-electrode shift quantity d) used to convert the reference negative-electrode OCP curve 150 to the negative-electrode OCP curve 150 # may be included in the index value. That is, a reliability which is common to all the parameters of the first parameter group and the second parameter group may be set, and the final first parameter group and the final second parameter group may be determined on the basis of the reliability.

What is claimed is:

1. A battery state diagnosing device comprising:
an acquisition unit configured to acquire time-series data including at least a current value and a voltage value of a battery;
a deterioration state estimating unit configured to estimate an index value associated with a deterioration state of the battery on the basis of the time-series data;
a reliability evaluating unit configured to evaluate a reliability of the index value on the basis of at least one of distribution information of the voltage value included in the time-series data and distribution information of a dischargeable capacity calculated using the current value included in the time-series data; and a deterioration state determining unit configured to determine a final index value on the basis of the reliability.

2. The battery state diagnosing device according to claim 1, wherein the deterioration state determining unit is configured to determine the final index value by adding a newest index value and a predicted index value based on previous index values at predetermined proportions corresponding to the reliability.

3. The battery state diagnosing device according to claim 2, wherein the reliability evaluating unit is configured to calculate at least one of a proportion of a voltage range of the time-series data with respect to a predetermined voltage range and a proportion of a dischargeable capacity range of the time-series data with respect to a capacity range of a reference Open Circuit Voltage (OCV) curve and to set the reliability to a lower value as the proportion becomes less.

4. The battery state diagnosing device according to claim 2, wherein the reliability evaluating unit is configured to calculate an error between the time-series data and a reference Open Circuit Voltage (OCV) curve and to set the reliability to a lower value as the error becomes greater.

5. The battery state diagnosing device according to claim 2, wherein the reliability evaluating unit is configured to acquire a plurality of sample groups by randomly extracting some of the time-series data, to calculate a plurality of index values on the basis of the acquired plurality of sample groups, and to set the reliability to a lower value as the plurality of index values become more uneven.

6. The battery state diagnosing device according to claim 2, wherein the reliability evaluating unit is configured to input at least one of the distribution information of the voltage value included in the time-series data and the distribution information of the dischargeable capacity calculated using the current value included in the time-series data and an error between the time-series data and a reference Open Circuit Voltage (OCV) curve to a machine learning model and to acquire an output of the machine learning model as the reliability.

7. The battery state diagnosing device according to claim 1, further comprising a reliability updating unit configured to update the reliability to a lower value when a difference between a newest index value and a representative value of previous index values is equal to or greater than a threshold value.

8. A battery state diagnosing device comprising:
an acquisition unit configured to acquire time-series data including at least a current value and a voltage value of a battery;
a deterioration state estimating unit configured to estimate an index value associated with a deterioration state of the battery on the basis of the time-series data;
a reliability evaluating unit configured to evaluate a reliability of the index value;
an upper limit setting unit configured to set an upper limit of the reliability on the basis of the index value and the reliability;
a reliability updating unit configured to update the reliability on the basis of the upper limit; and
a deterioration state determining unit configured to determine a final index value on the basis of the updated reliability.

9. The battery state diagnosing device according to claim 8, further comprising a tracking delay error calculating unit configured to calculate a virtual index value on the basis of the reliability and a reference deterioration change line indicating a change of the index value with time and to calculate a tracking delay error which is a difference between the index value calculated on the basis of the reference deterioration change line and the virtual index value,
wherein the upper limit setting unit is configured to set the upper limit of the reliability to a greater value as the tracking delay error becomes larger.

10. The battery state diagnosing device according to claim 8, wherein the deterioration state determining unit is configured to determine the final index value by adding a newest index value and a predicted index value based on previous index values at predetermined proportions corresponding to the reliability.

11. The battery state diagnosing device according to claim 10, wherein the reliability evaluating unit is configured to calculate at least one of a proportion of a voltage range of the time-series data with respect to a predetermined voltage range and a proportion of a dischargeable capacity range of the time-series data with respect to a capacity range of a reference Open Circuit Voltage (OCV) curve and to set the reliability to a lower value as the proportion becomes less.

12. The battery state diagnosing device according to claim 10, wherein the reliability evaluating unit is configured to calculate an error between the time-series data and a reference Open Circuit Voltage (OCV) curve and to set the reliability to a lower value as the error becomes greater.

13. The battery state diagnosing device according to claim 10, wherein the reliability evaluating unit is configured to acquire a plurality of sample groups by randomly extracting some of the time-series data, to calculate a plurality of index values on the basis of the acquired plurality of sample groups, and to set the reliability to a lower value as the plurality of index values become more uneven.

14. The battery state diagnosing device according to claim 10, wherein the reliability evaluating unit is configured to input at least one of distribution information of the voltage value included in the time-series data and distribution information of the dischargeable capacity calculated using the current value included in the time-series data and an error between the time-series data and a reference Open Circuit Voltage (OCV) curve to a machine learning model and to acquire an output of the machine learning model as the reliability.

15. A battery state diagnosing method that is performed by a battery state diagnosing device, the battery state diagnosing method comprising:
acquiring time-series data including at least a current value and a voltage value of a battery;
estimating an index value associated with a deterioration state of the battery on the basis of the time-series data;
evaluating a reliability of the index value on the basis of at least one of distribution information of the voltage value included in the time-series data and distribution information of a dischargeable capacity calculated using the current value included in the time-series data; and
determining a final index value on the basis of the reliability.

16. A non-transitory computer-readable storage medium storing a program that is executed by a processor of a battery state diagnosing device, the program causing the processor to perform:
acquiring time-series data including at least a current value and a voltage value of a battery;
estimating an index value associated with a deterioration state of the battery on the basis of the time-series data;
evaluating a reliability of the index value on the basis of at least one of distribution information of the voltage value included in the time-series data and distribution information of a dischargeable capacity calculated using the current value included in the time-series data; and determining a final index value on the basis of the reliability.

\* \* \* \* \*